(12) United States Patent
Elsherbini et al.

(10) Patent No.: US 12,438,087 B2
(45) Date of Patent: Oct. 7, 2025

(54) HIGH THROUGHPUT ADDITIVE MANUFACTURING FOR INTEGRATED CIRCUIT COMPONENTS CONTAINING TRACES WITH FEATURE SIZE AND GRAIN BOUNDARIES

(71) Applicant: Intel Corporation, Santa Clara, CA (US)

(72) Inventors: Adel Elsherbini, Chandler, AZ (US); Aleksandar Aleksov, Chandler, AZ (US); Feras Eid, Chandler, AZ (US); Wenhao Li, Chandler, AZ (US); Stephen Morein, San Jose, CA (US); Yoshihiro Tomita, Tsukuba (JP)

(73) Assignee: Intel Corporation, Santa Clara, CA (US)

( * ) Notice: Subject to any disclaimer, the term of this patent is extended or adjusted under 35 U.S.C. 154(b) by 714 days.

(21) Appl. No.: 17/484,281

(22) Filed: Sep. 24, 2021

(65) Prior Publication Data

US 2023/0099827 A1  Mar. 30, 2023

(51) Int. Cl.
*H01L 23/532* (2006.01)
*H01L 21/768* (2006.01)

(52) U.S. Cl.
CPC .. *H01L 23/53238* (2013.01); *H01L 21/76801* (2013.01); *H01L 21/7684* (2013.01); *H01L 21/76841* (2013.01)

(58) Field of Classification Search
CPC ......... H01L 23/53238; H01L 21/76801; H01L 21/7684; H01L 21/76841; H01L 21/4857; H01L 23/5383; H05K 1/09; H05K 3/14; B33Y 10/00; B33Y 80/00
See application file for complete search history.

(56) References Cited

U.S. PATENT DOCUMENTS

| | | | |
|---|---|---|---|
| 10,586,724 B2 | 3/2020 | Hu et al. | |
| 11,257,790 B2 | 2/2022 | Leschkies et al. | |
| 2003/0186535 A1 | 10/2003 | Wong et al. | |
| 2004/0124002 A1 | 7/2004 | Mazzochette et al. | |
| 2014/0268534 A1 | 9/2014 | Sidhu et al. | |
| 2016/0268145 A1* | 9/2016 | Meng | H01L 21/563 |
| 2019/0312016 A1 | 10/2019 | O'Sullivan et al. | |
| 2020/0227335 A1* | 7/2020 | Eid | H01L 23/053 |

(Continued)

FOREIGN PATENT DOCUMENTS

KR  1020150077300 A  * 7/2015  ............... H05K 1/09

OTHER PUBLICATIONS

PCT International Search Report and Written Opinion issued in PCT/US2022/039304, dated Nov. 17, 2022; 10 pages.

(Continued)

*Primary Examiner* — John P. Dulka
(74) *Attorney, Agent, or Firm* — Alliance IP, LLC

(57) ABSTRACT

Technologies for high throughput additive manufacturing (HTAM) structures are disclosed. In one embodiment, a sacrificial dielectric is formed to provide a negative mask on which to pattern a conductive trace using HTAM. In another embodiment, a permanent dielectric is patterned using a processing such as laser project patterning. A conductive trace can then be patterned using HTAM. In yet another embodiment, conductive traces with tapered sidewalls can be patterned, and then a buffer layer and HTAM layer can be deposited on top.

25 Claims, 32 Drawing Sheets

(56) References Cited

U.S. PATENT DOCUMENTS

| | | |
|---|---|---|
| 2020/0235082 A1 | 7/2020 | Eid et al. |
| 2021/0398895 A1 | 12/2021 | Elsherbini et al. |
| 2021/0407903 A1 | 12/2021 | Elsherbini et al. |
| 2023/0063304 A1* | 3/2023 | Liu .................. H01L 23/49822 |

OTHER PUBLICATIONS

"Cold Spraying;" Wikipedia, as accessed Oct. 28, 2021 at https://en.wikipedia.org/wiki/Cold_spraying, 6 pages.

U.S. Appl. No. 17/484,213, filed Sep. 24, 2021 entitled Conformal Power Delivery Structures (54 pages).

U.S. Appl. No. 17/484,329, filed Sep. 24, 2021, entitled Technologies for High Throughput Additive Manufacturing for Integrated Circuit Components (80 pages).

U.S. Appl. No. 17/484,339, filed Sep. 24, 2021 entitled Technologies for High Throughput Additive Manufacturing for Integrated Circuit Components (80 pages).

USPTO Office Action received in U.S. Appl. No. 17/484,329, dated Apr. 11, 2025, 29 pages.

\* cited by examiner

HIGH THROUGHPUT ADDITIVE MANUFACTURING FOR INTEGRATED CIRCUIT COMPONENTS CONTAINING TRACES WITH FEATURE SIZE AND GRAIN BOUNDARIES

BACKGROUND

High throughput additive manufacturing techniques such as cold spray can enable thick conductor layers. The location of a cold spray deposition can be controlled by mechanically moving the cold spray nozzle or material being sprayed. However, cold spray typically cannot be used to directly create fine features or features with high aspect ratios. Standard photoresist cannot be used to create finer features, as the cold spray may ablate the soft photoresist as cold spray particles bombard it.

DETAILED DESCRIPTION

Figure 1:
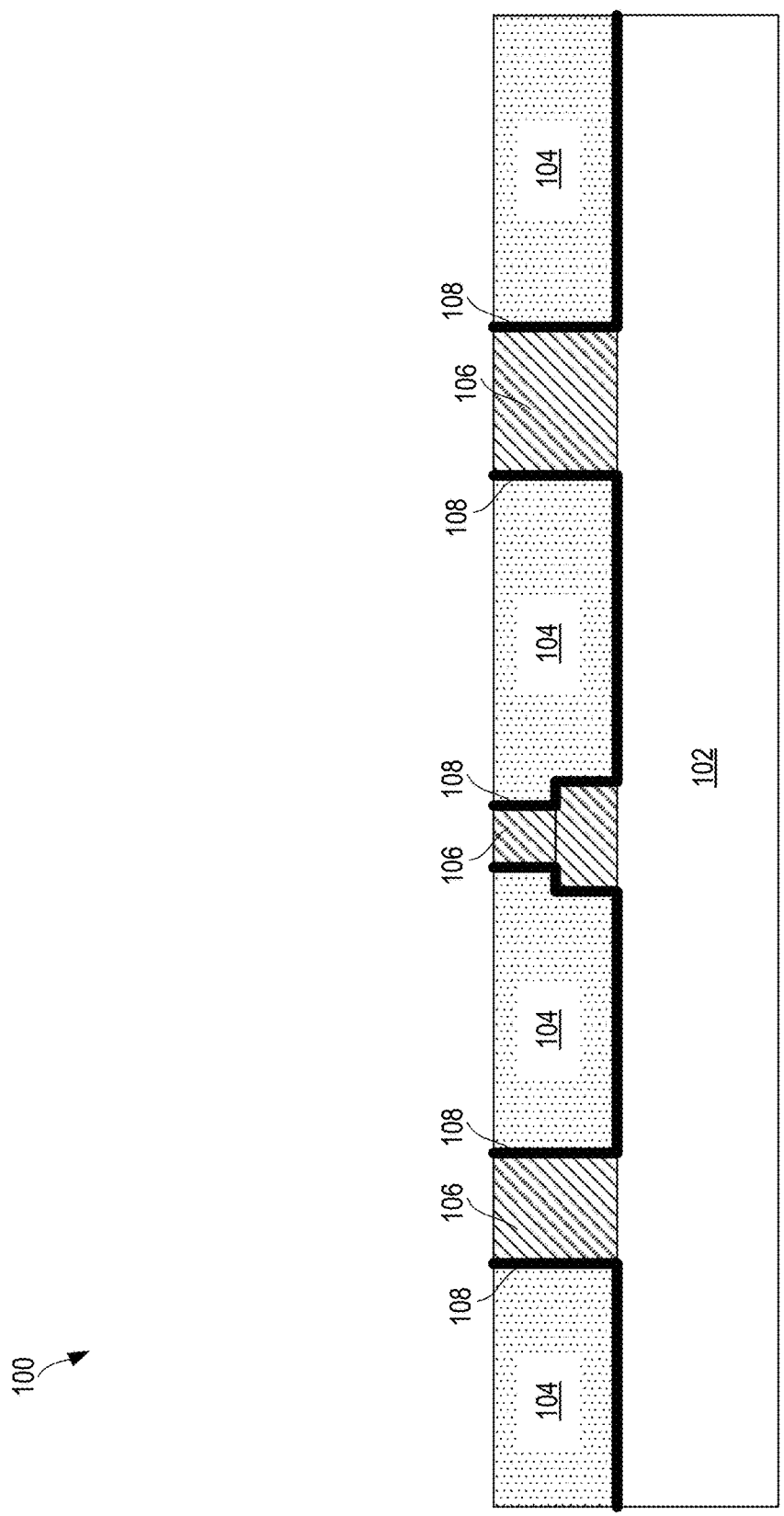
FIG. 1 illustrates an example system that includes a thick conductive trace in accordance with embodiments of the present disclosure.

Aspects of the present disclosure may include structures created by cold spray or other high throughput additive manufacturing (HTAM) techniques with fine structures and/or structures with a high aspect ratios. As described in more detail below, such structures can be made with various combinations of additive and subtractive manufacturing techniques. In one embodiment, a sacrificial patterned dielectric serves as a mask for an HTAM layer and is then removed. In another embodiment, a permanent dielectric is patterned, and the HTAM layer is added on top of it. In yet another embodiment, subtractive etching is used to pattern features with tapered sidewalls, on which an HTAM layer can be added.

In the following description, specific details are set forth, but embodiments of the technologies described herein may be practiced without these specific details. Well-known circuits, structures, and techniques have not been shown in detail to avoid obscuring an understanding of this description. Phrases such as "an embodiment," "various embodiments," "some embodiments," and the like may include features, structures, or characteristics, but not every embodiment necessarily includes the particular features, structures, or characteristics.

In the following description, for purposes of explanation, numerous specific details are set forth in order to provide a thorough understanding thereof. It may be evident, however, that the novel embodiments can be practiced without these specific details. In other instances, well-known structures and devices are shown in block diagram form in order to facilitate a description thereof. The intention is to cover all modifications, equivalents, and alternatives within the scope of the claims.

Some embodiments may have some, all, or none of the features described for other embodiments. "First," "second," "third," and the like describe a common object and indicate different instances of like objects being referred to. Such adjectives do not imply objects so described must be in a given sequence, either temporally or spatially, in ranking, or any other manner. "Connected" may indicate elements are in direct physical or electrical contact, and "coupled" may indicate elements co-operate or interact, but they may or may not be in direct physical or electrical contact. Furthermore, the terms "comprising," "including," "having," and the like, as used with respect to embodiments of the present disclosure, are synonymous. Terms modified by the word "substantially" include arrangements, orientations, spacings, or positions that vary slightly from the meaning of the unmodified term. For example, a substrate assembly feature, such as a through width, that is described as having substantially a listed dimension can vary within a few percent of the listed dimension.

As used herein, the phrase "communicatively coupled" refers to the ability of a component to send a signal to or receive a signal from another component. The signal can be any type of signal, such as an input signal, an output signal, or a power signal. A component can send or receive a signal to another component to which it is communicatively coupled via a wired or wireless communication medium (e.g., conductive traces, conductive contacts, air). Examples of components that are communicatively coupled include integrated circuit dies located in the same package that communicate via an embedded bridge in a package substrate and an integrated circuit component attached to a printed circuit board that send signals to or receives signals from other integrated circuit components or electronic devices attached to the printed circuit board.

It will be understood that in the examples shown and described further below, the figures may not be drawn to scale and may not include all possible layers and/or circuit components. In addition, it will be understood that although certain figures illustrate transistor designs with source/drain regions, electrodes, etc. having orthogonal (e.g., perpendicular) boundaries, embodiments herein may implement such boundaries in a substantially orthogonal manner (e.g., within +/−5 or 10 degrees of orthogonality) due to fabrication methods used to create such devices or for other reasons.

As used herein, the phrase "located on" in the context of a first layer or component located on a second layer or component refers to the first layer or component being directly physically attached to the second part or component (no layers or components between the first and second layers or components) or physically attached to the second layer or component with one or more intervening layers or components.

As used herein, the term "adjacent" refers to layers or components that are in physical contact with each other. That is, there is no layer or component between the stated adjacent layers or components. For example, a layer X that is adjacent to a layer Y refers to a layer that is in physical contact with layer Y.

As used herein, the terms "upper"/"lower" or "above"/"below" may refer to relative locations of an object (e.g., the surfaces described above), especially in light of examples shown in the attached figures, rather than an absolute location of an object. For example, an upper surface of an apparatus may be on an opposite side of the apparatus from a lower surface of the object, and the upper surface may be facing upward generally only when viewed in a particular way. As another example, a first object above a second object may be on or near an "upper" surface of the second object rather than near a "lower" surface of the object, and the first object may be truly above the second object only when the two objects are viewed in a particular way.

Reference is now made to the drawings, which are not necessarily drawn to scale, wherein similar or same numbers may be used to designate the same or similar parts in different figures. The use of similar or same numbers in different figures does not mean all figures including similar or same numbers constitute a single or same embodiment. Like numerals having different letter suffixes may represent different instances of similar components. The drawings illustrate generally, by way of example, but not by way of limitation, various embodiments discussed in the present document.

Referring now to FIG. 1, in one embodiment, a cross-sectional side view of a system 100 that includes a package substrate 102 is shown. Conductive traces 104 and dielectric traces 106 are positioned over the package substrate 102. A buffer layer 108 separates the conductive traces 104 from the dielectric traces 106 and/or the package substrate 102.

In some embodiments, the package substrate 102 may be connected to a main board, connected to another package substrate, or otherwise connected to one or more additional components. In some embodiments, the system 100 may include or form a part of a die, such as a die of an integrated circuit component. Additionally or alternatively, the system 100 may include or form a part of a circuit board, such as a main board of a computing device. The package substrate 102 may be an organic or inorganic package, an active or passive semiconductor die, or a reusable carrier. The package substrate 102 may be, e.g., silicon, copper, silicon dioxide, or any other suitable material. In some embodiments, the conductive traces 104 and/or the dielectric traces 106 may be removed from the package substrate 102 and transferred to another component. In some embodiments, one or more layers of conductive traces and other components may be between the package substrate 102 and the conductive traces 104. The package substrate 102 may include or be embodied as one or more layers of an integrated circuit component, such as a layer with conductive or dielectric traces.

The conductive traces 104 may be any suitable material, such as copper, aluminum, titanium, gold, silver, or other metal or alloy. In the illustrative embodiment, the conductive traces 104 are copper. The conductive traces 104 may be a pure metal or may include one or more fillers. For example, the conductive traces 104 may be copper with diamond or silica filler particles. The filler particles may be, e.g., diamond, silica, silicon carbide, aluminum nitride, boron nitride, etc. The filler particles may change the electrical, mechanical, and/or thermal properties of the conductive traces 104, such as changing the thermal conductivity or changing the coefficient of thermal expansion. The conductive traces 104 may have a physical grain structure that is characteristic of a cold spray structure, as discussed below in more detail in regard to FIG. 27. In the illustrative embodiment, the conductive traces 104 may have any suitable thickness, such as 10-1,000 micrometers. The conductive traces 104 may have any suitable length of width, such as 1-100,000 micrometers.

The dielectric traces 106 may be any suitable dielectric material, such as an organic or inorganic dielectric traces 106. In some embodiments, the dielectric traces 106 may be silicon dioxide, silicon nitride, or a layered inorganic dielectric. In other embodiments, the dielectric traces 106 may be an organic dielectric such as a polymer or epoxy. The organic dielectric may contain fillers such as silica particles.

As discussed below in regard to FIG. 6, in some embodiments, the system 100 may have one or more voids in place of the dielectric traces 106.

In the illustrative embodiment, the buffer layer 108 provides a layer for the cold spray or other HTAM particles to attach to. The buffer layer 108 may also protect the one or more layers (e.g., sacrificial dielectric traces 202 discussed below in regard to FIG. 2) underneath it when the conductive traces 104 are applied using cold spray or other HTAM technique. The buffer layer 108 may also act as a barrier that prevents atomic diffusion or ion migration of the conductor material of the conductive traces 104 into the dielectric traces 106, which may later lead to electric current leakage or electric shorts. The buffer layer 108 may be any material or combination of materials onto which copper or other suitable material can be applied by cold spray, such as titanium, tantalum, gold, nickel, vanadium, silver, or copper. It may also include layers of such materials of different thicknesses such as a thin layer of titanium followed by a thicker layer of copper. The buffer layer 108 may be created using any suitable process such as physical vapor deposition, chemical vapor deposition, electroless plating, or electroplating. It may also be created using a combination of such materials.

Figure 2:
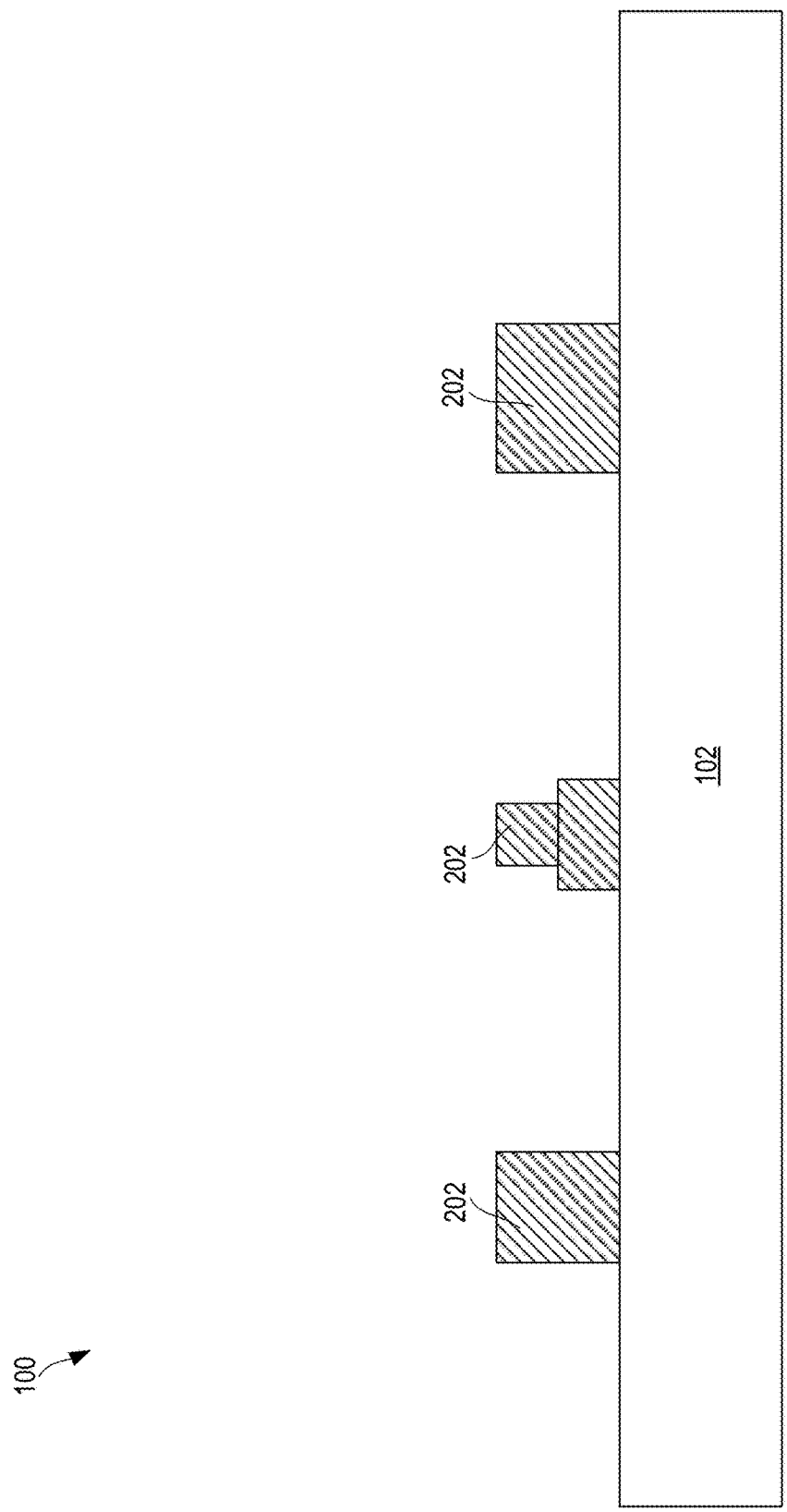
FIG. 2 illustrates an example system at one step of a method for creating the system of FIG. 1.

Referring now to FIG. 2, in one embodiment, in order to create the system 100 shown in FIG. 1, one or more sacrificial dielectric traces 202 are patterned onto a package substrate 102. The sacrificial dielectric traces 202 may be a lithographically patternable dielectric (e.g., a photoresist), a laser patternable dielectric, or a reactive ion etched dielectric created using a mask that is subsequently removed. Additionally or alternatively, in some embodiments, the sacrificial dielectric traces 202 may be an additively manufactured layer using, e.g., inkjet printing. Such sacrificial dielectric traces 202 may be, e.g., a polymer, epoxy, elastomer, polyimide, or silicone. It may also contain fillers such as, e.g., silica particles to control its mechanical properties. The sacrificial dielectric traces 202 may have multiple layers and/or 3D patterning features created using, e.g., grayscale lithography. In some embodiments, the sacrificial layer 202 may be a sacrificial conductive layer 202. For example, a sacrificial conductive layer 202 may be deposited using electroplating. The sacrificial conductive layer may be any suitable material, such as copper, aluminum, silver, etc.

Figure 3:
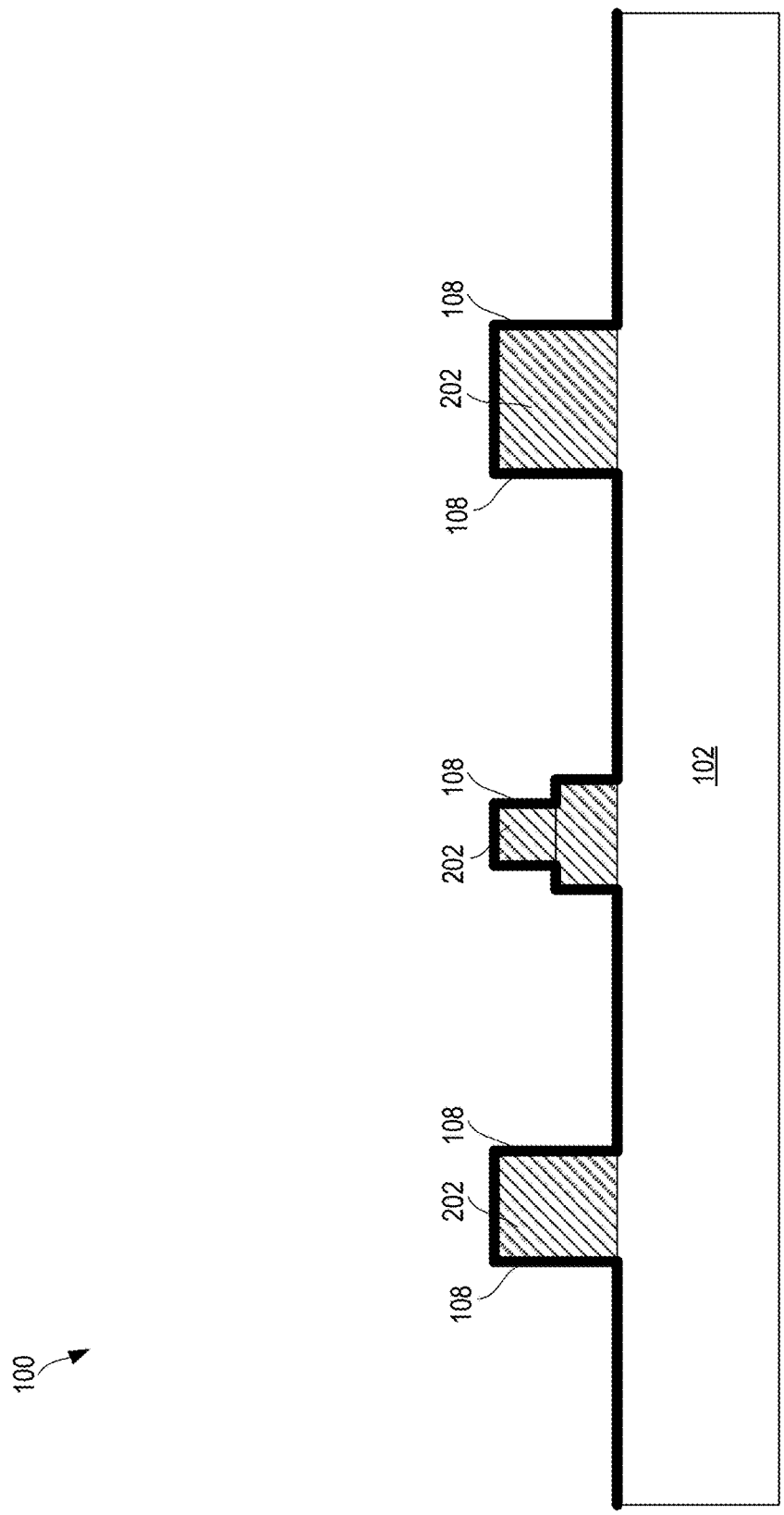
FIG. 3 illustrates an example system at one step of a method for creating the system of FIG. 1.

Referring now to FIG. 3, a buffer layer 108 is added on top of the sacrificial dielectric traces 202. The buffer layer 108 may be deposited using any suitable conformal thin film deposition method or combination of methods, such as chemical vapor deposition, plasma enhanced chemical vapor deposition, atomic layer deposition, electroless plating, electroplating, etc. In some embodiments, a thin seed layer may be applied (using, e.g., sputtering), and then a thicker layer may be applied using, e.g., electroplating. The buffer layer 108 may have any suitable thickness, such as 10 nanometers to 20 micrometers.

Figure 4:
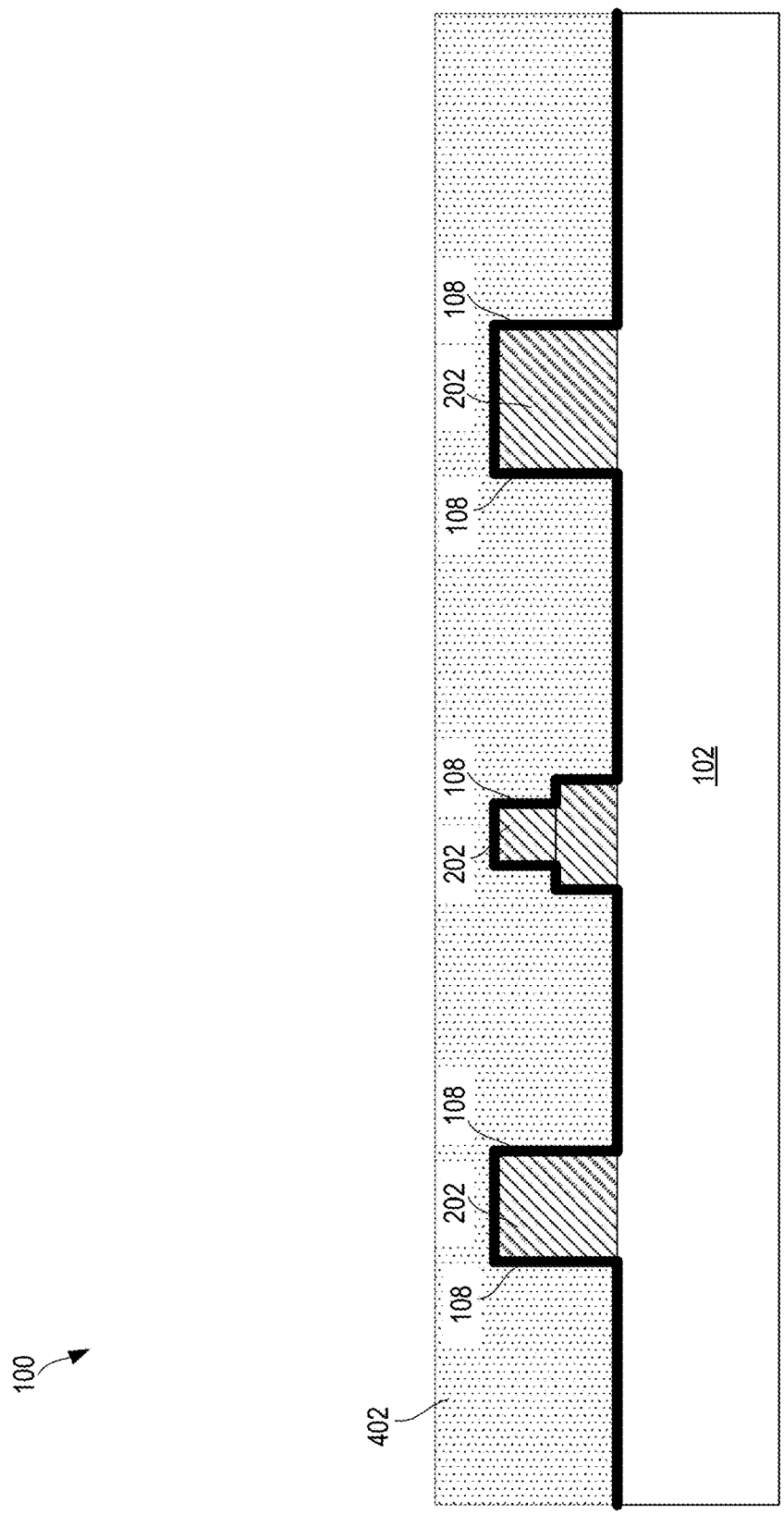
FIG. 4 illustrates an example system at one step of a method for creating the system of FIG. 1.

Referring now to FIG. 4, a conductive layer 402 is applied over the buffer layer 108 using cold spray or other HTAM technique. A mask or stencil may be used to coarsely control where the conductive layer 402 is applied with a resolution of, e.g., 100 micrometers. It should be appreciated that the sacrificial dielectric traces 202 can have features with a smaller size, allowing features of the conductive layer 402 to be finer than they otherwise would be with a mask. The conductive layer 402 may be applied uniformly over the applicable area, or a mask may be used to selectively apply different amounts to different areas to improve material utilization and improve gap filling.

Figure 5:
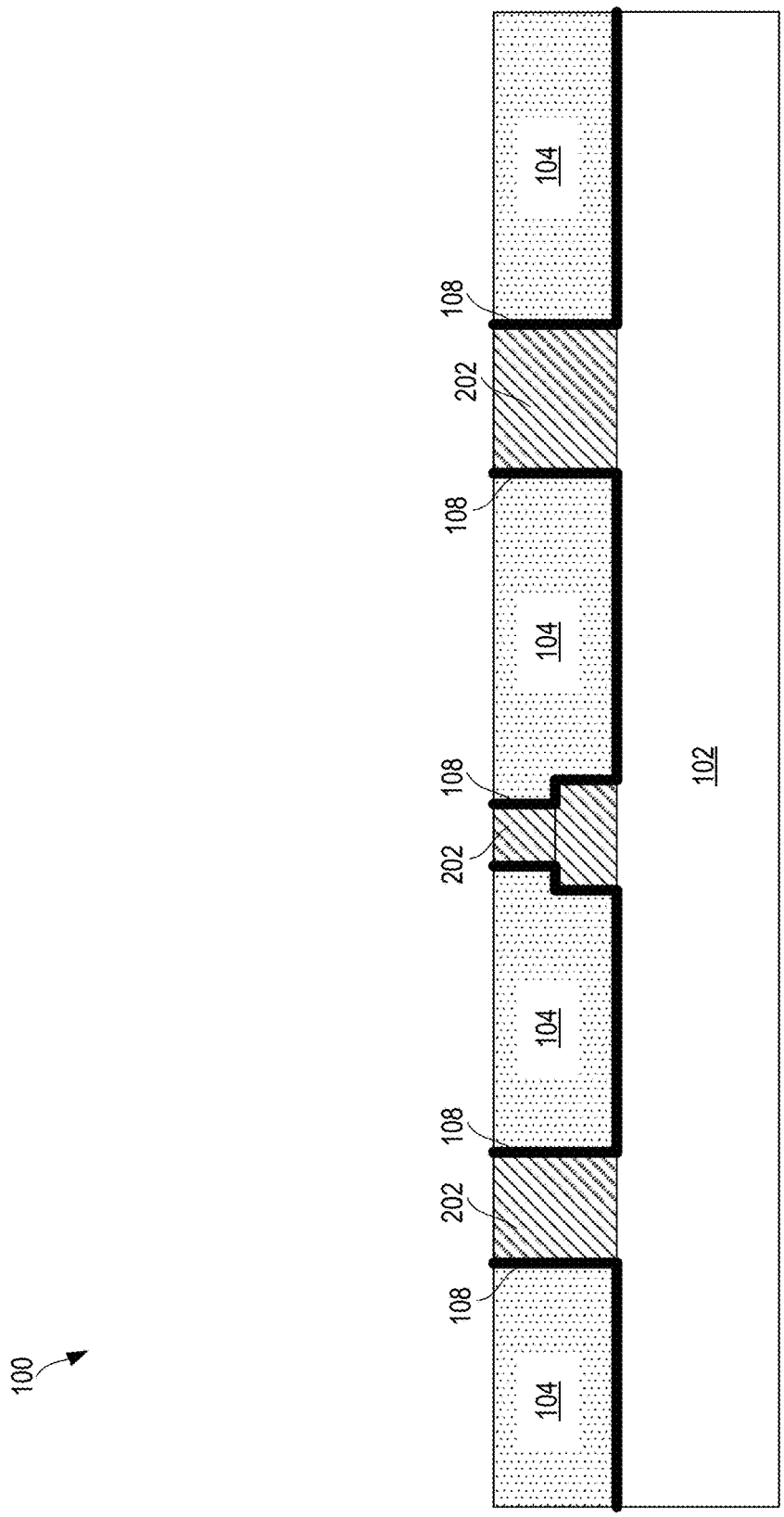
FIG. 5 illustrates an example system at one step of a method for creating the system of FIG. 1.

Referring now to FIG. 5, the conductive layer 402 is planarized to expose the sacrificial dielectric traces 202, creating conductive traces 104. Any suitable technique may be used to planarize the conductive layer 402, such as fly cutting, mechanical grinding, or chemical mechanical polishing.

Figure 6:
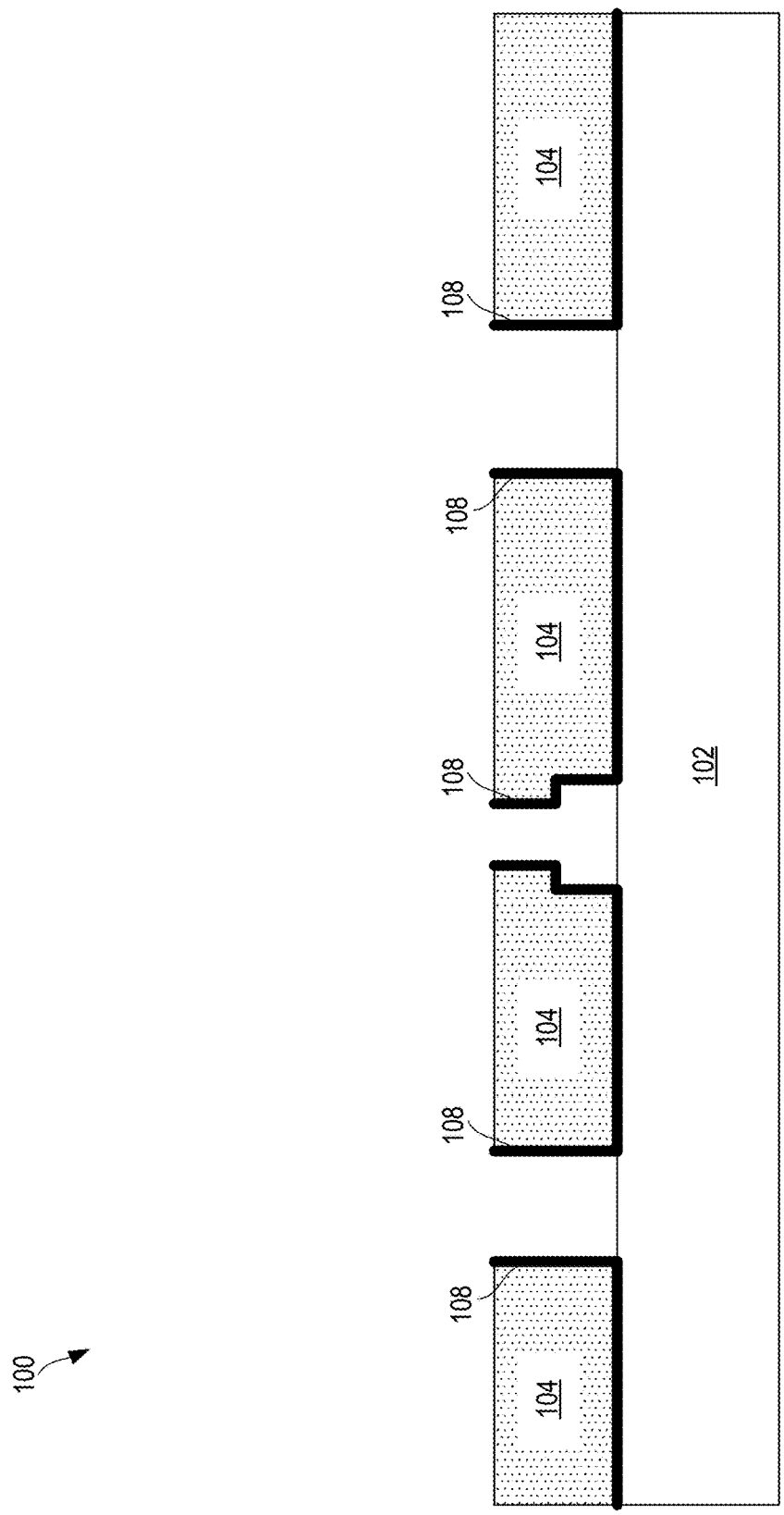
FIG. 6 illustrates an example system at one step of a method for creating the system of FIG. 1.

Referring now to FIG. 6, in the illustrative embodiment, the sacrificial dielectric traces 202 are removed. The sacrificial dielectric traces 202 may be removed using any suitable technique, such as chemical etching or reactive ion etching. In some embodiments, the sacrificial dielectric traces 202 may be left in place for electrical or mechanical reasons. In such embodiments, the dielectric traces 202 may be the same as the dielectric traces 106. In embodiments with traces 202 that are conductive, an etchant may be used that preferentially etches the traces 202 that are conductive and leaves the conductive traces 104 in place.

In some embodiments, after the sacrificial dielectric traces 202 are removed, the dielectric traces 106 is deposited. In other embodiments, after the sacrificial dielectric traces 202 are removed, the voids that remain may be left in place.

Figure 7:
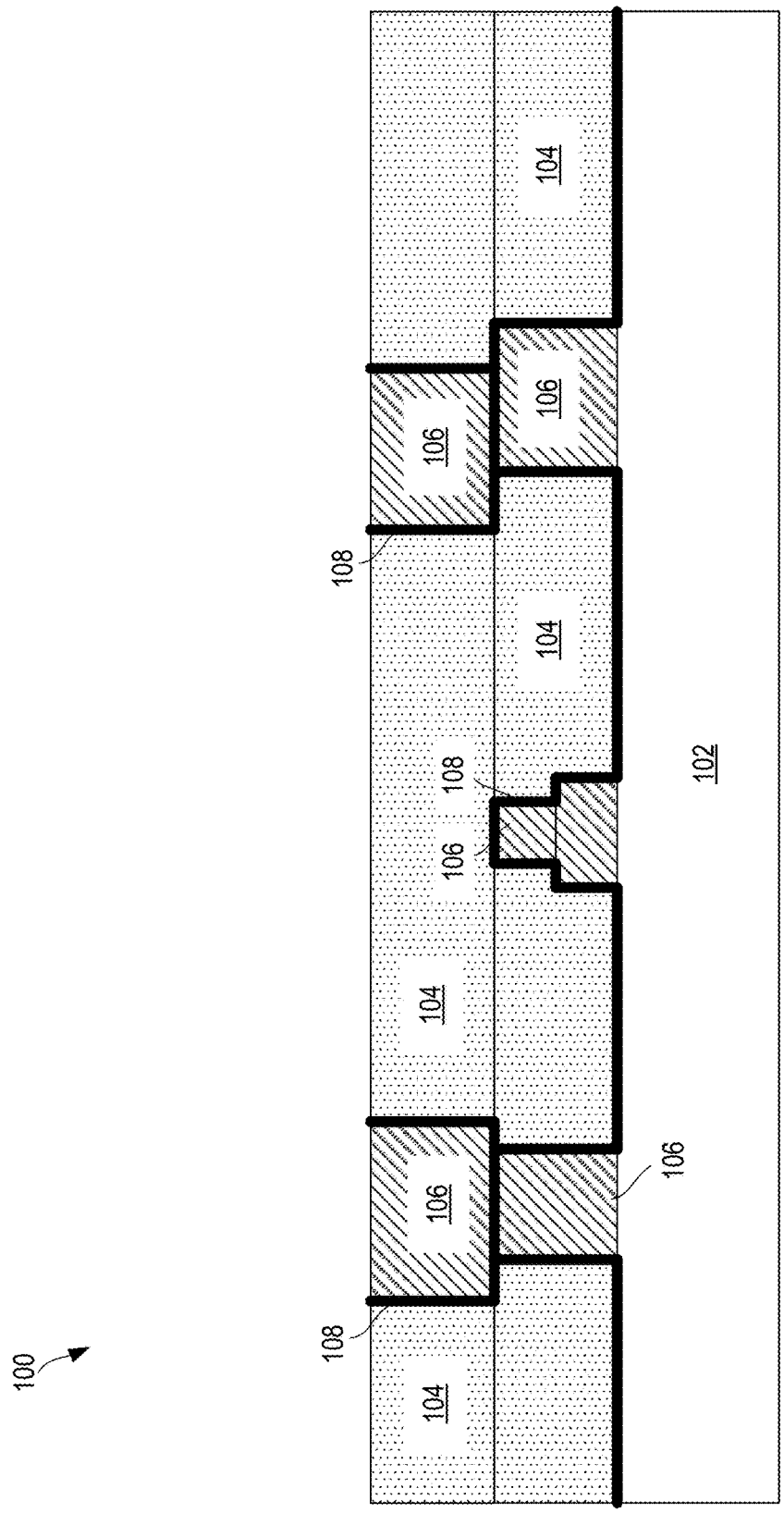
FIG. 7 illustrates an example system that includes two or more layers of thick conductive trace in accordance with embodiments of the present disclosure.
Figure 8:
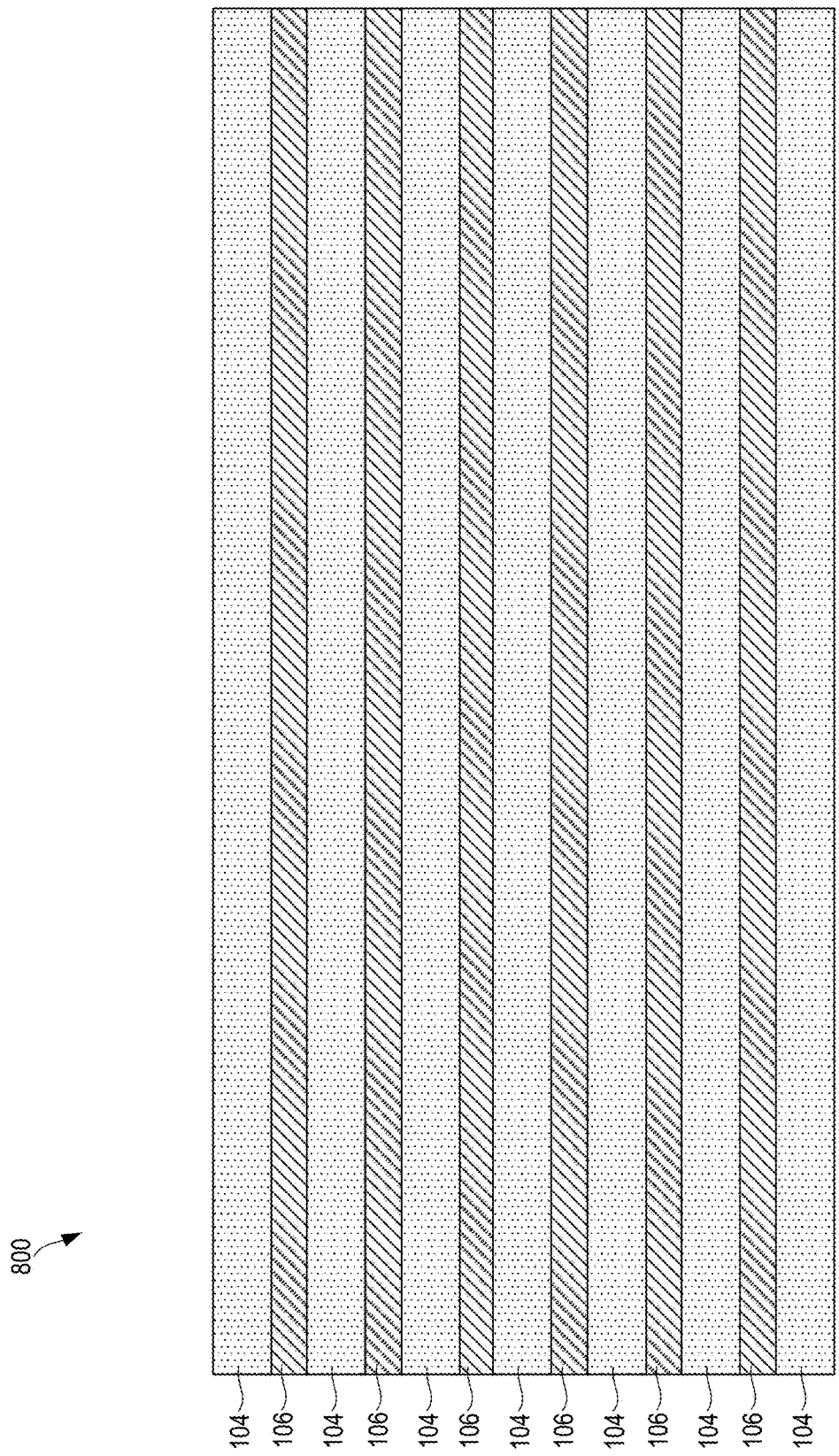
FIG. 8 illustrates an example system that includes strips of thick conductive traces.
Figure 9:
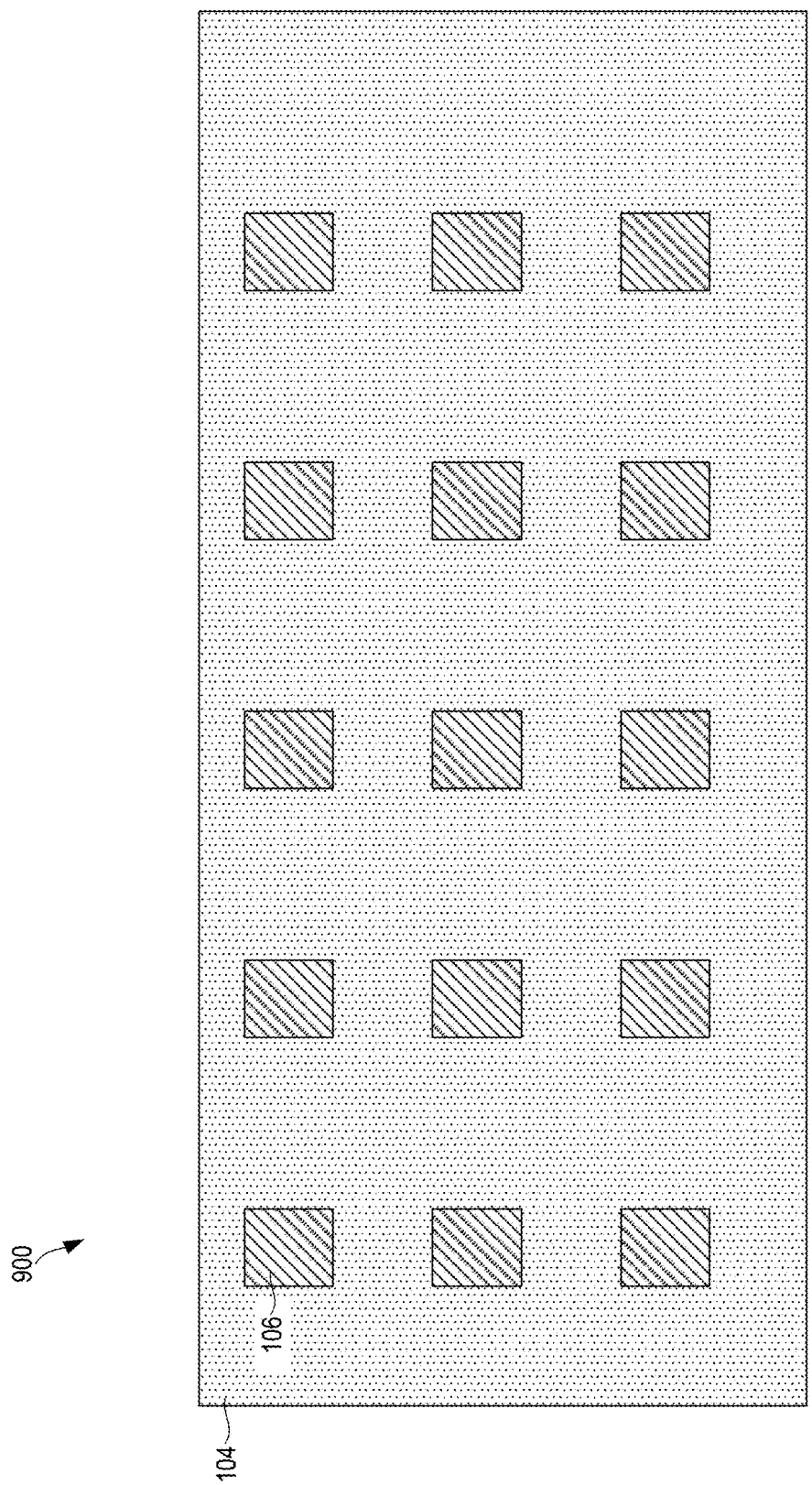
FIG. 9 illustrates an example system that includes a grid pattern of thick conductive traces.

Referring now to FIGS. 7-9, in some embodiments, different layer configurations may be used. For example, in some embodiments, the techniques described above may be used to create multiple layers of conductive traces 104, as shown in FIG. 7. In some embodiments, as shown in a top-down view of a system 800 in FIG. 8, conductive traces 104 may be arranged in lines, such as one or more signal routing lines. In other embodiments, as shown in a top-down view of a system 900 in FIG. 9, a power grid may be formed.

Figure 10:
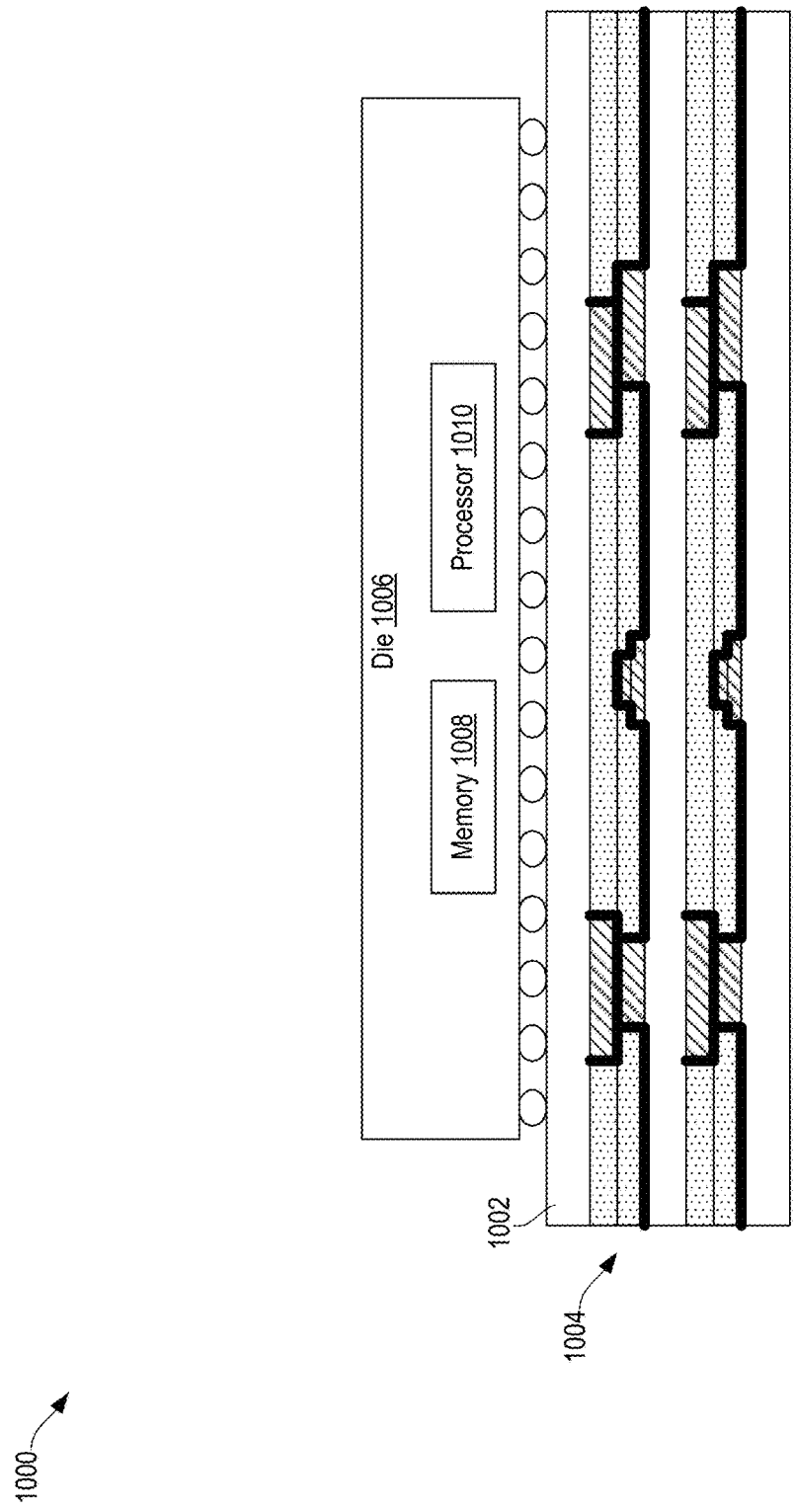
FIG. 10 illustrates an example system with one or more thick conductive traces in a circuit board.

Referring now to FIG. 10, in one embodiment, a system 1000 includes a substrate 1002 with one or more HTAM structures 1004 defined in one or more interior layers of the substrate 1002. A die 1006 may be mounted on the substrate 1002. The die 1006 may include circuitry such as memory circuitry 1008 and processor circuitry 1010, as well as other circuitry such as other logic circuitry, e.g., a field-programmable gate array (FPGA), application-specific integrated circuit (ASIC), central processor unit (CPU) circuitry, graphics processing unit (GPU) circuitry, or other types of digital logic circuitry. Further, the die 1006 may be more complex than illustrated in some embodiments. For example, the die 1006 may be implemented as a die stack in some embodiments or may be implemented as several different dies on an organic or inorganic interposer apparatus.

The substrate 1002 may be similar to the substrate 102. The HTAM structure 1004 may be similar to the structure shown in the system 100, i.e., conductive traces 104 and dielectric traces 106 separated by a buffer layer 108. The HTAM structure 1004 may provide, e.g., improved power delivery and/or lower electrical or thermal resistance in the substrate 1002.

Figure 11:
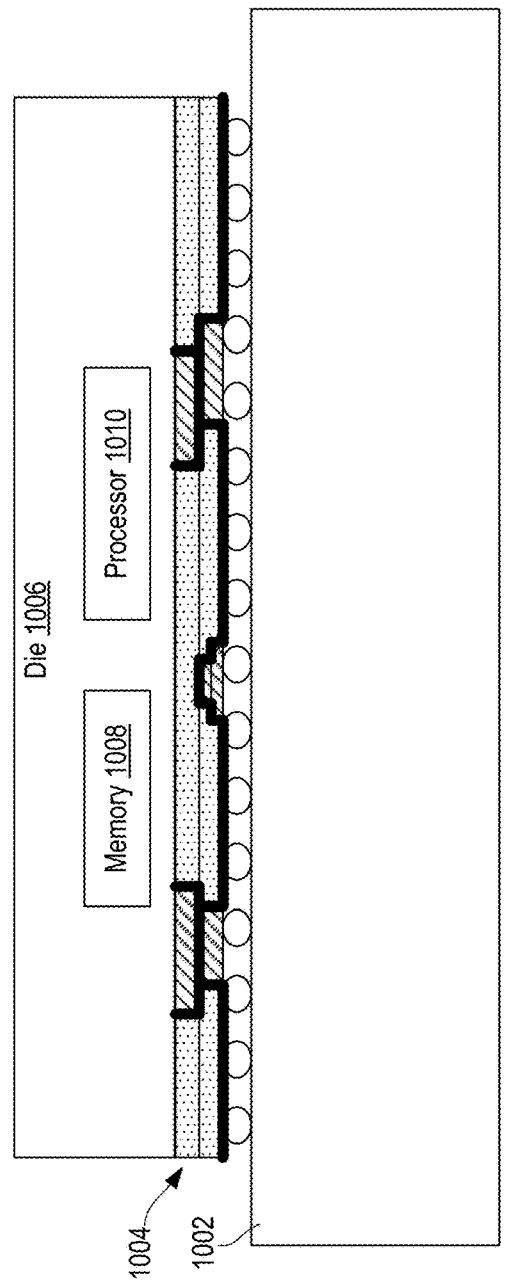
FIG. 11 illustrates an example system with one or more thick conductive traces on a bottom surface of a die.
Figure 12:
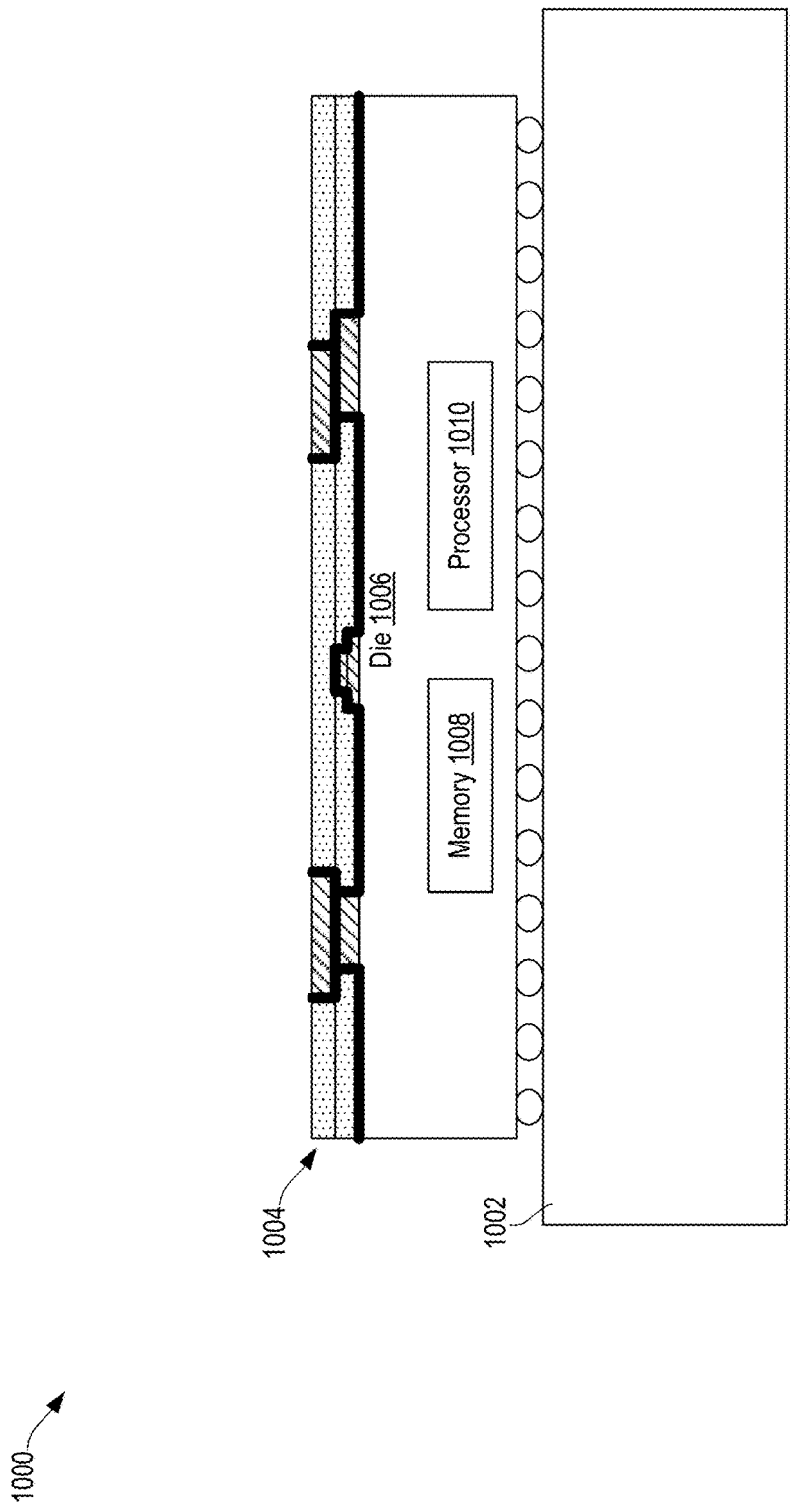
FIG. 12 illustrates an example system with one or more thick conductive traces on a top surface of a die.
Figure 13:
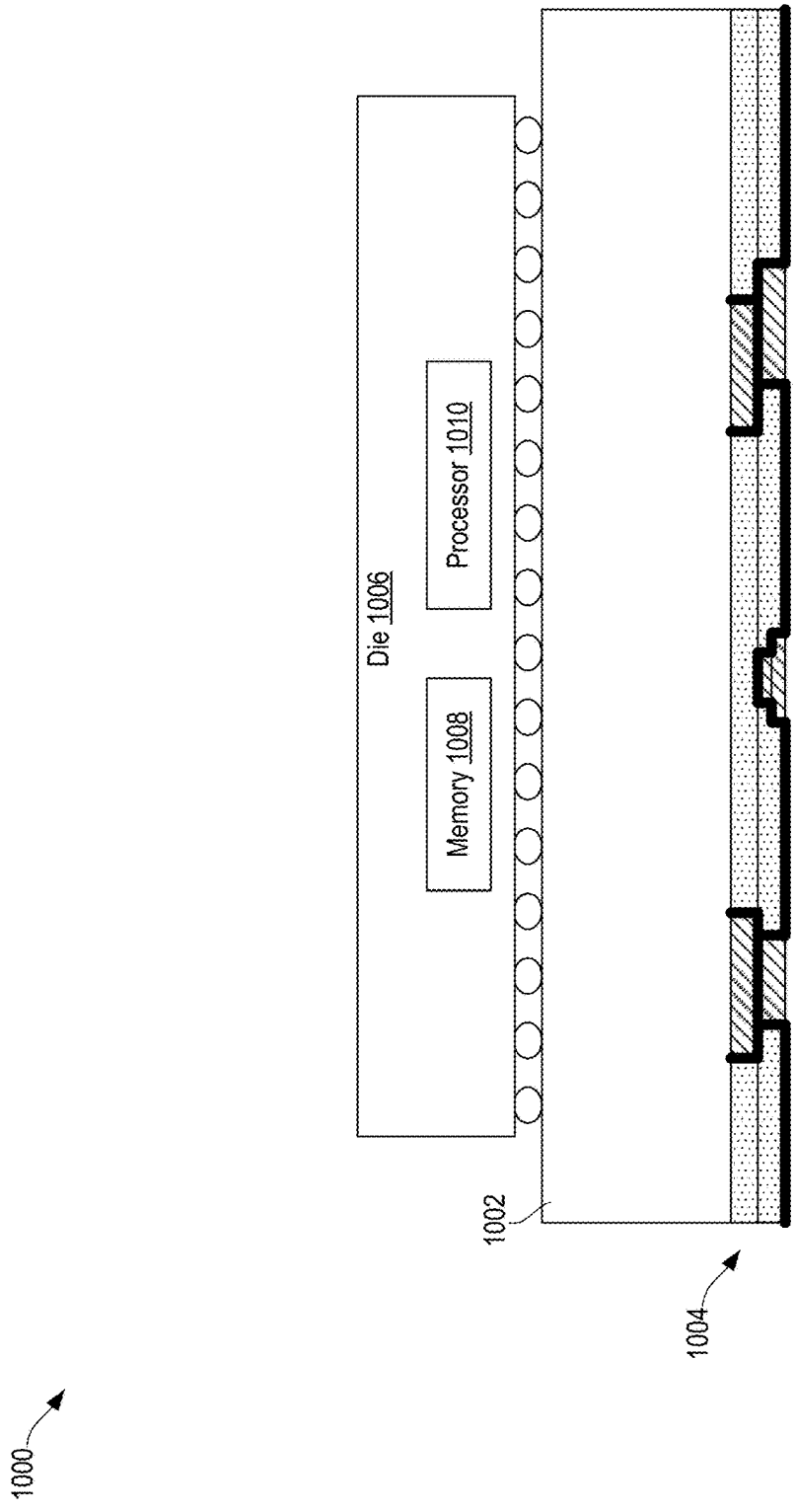
FIG. 13 illustrates an example system with one or more thick conductive traces on a bottom surface of a circuit board.

Additionally or alternatively, in other embodiments, the HTAM structure 1004 may be in different locations. For example, in some embodiments, the HTAM structure 1004 may be on the front side of the die 1006 (i.e., on the side mated with the substrate 1002), as shown in FIG. 11. In other embodiments, the HTAM structure 1004 may be on the backside of the die 1006 (i.e., opposite the side mated to the substrate 1002), as shown in FIG. 12. The HTAM structure 1004 may improve thermal dissipation and/or power delivery performance on the die 1006. In still other embodiments, the HTAM structure 1004 may be on the bottom surface of the substrate 1002, as shown in FIG. 13. The HTAM structure 1004 on a surface of the substrate 1002 may improve electric resistance and/or mechanical strength.

Figure 14:
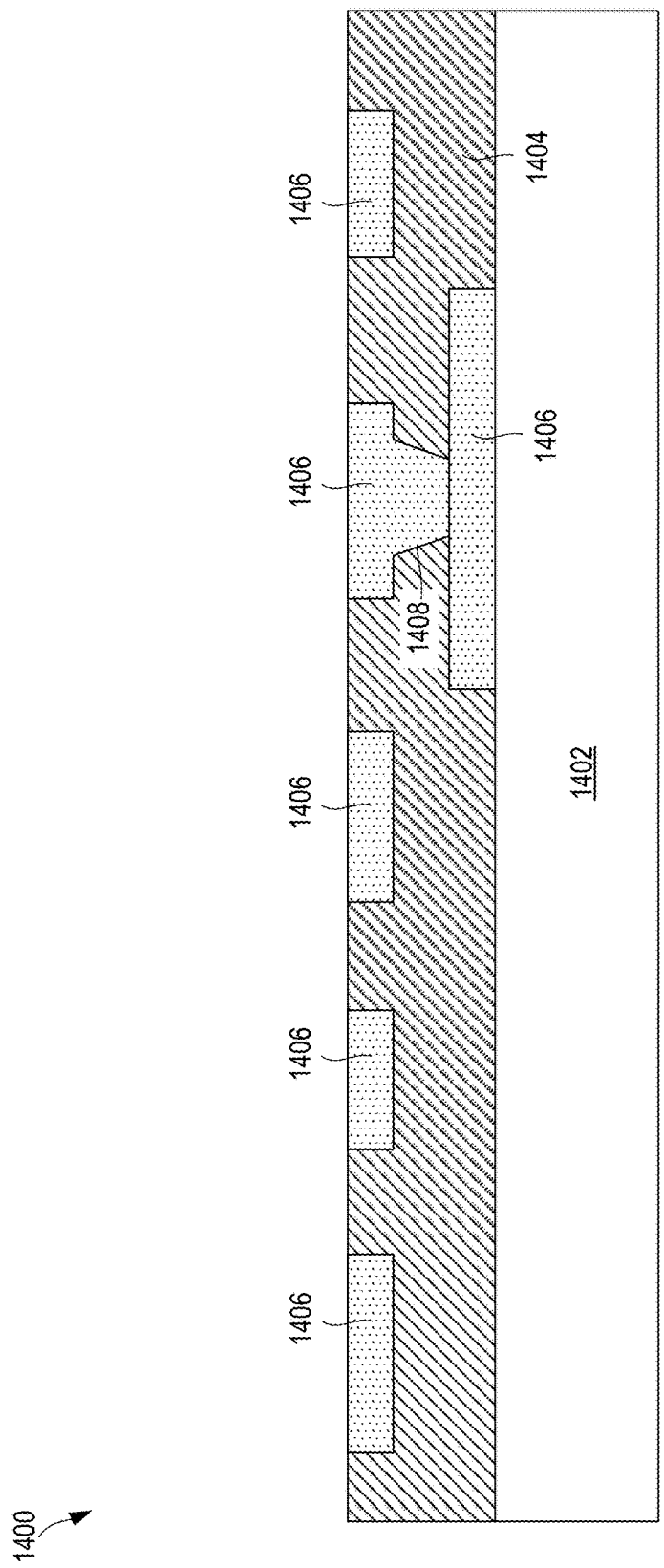
FIG. 14 illustrates an example system that includes a thick conductive trace in accordance with embodiments of the present disclosure.

Referring now to FIG. 14, in one embodiment, a system 1400 includes a package substrate 1402. One or more conductive traces 1406 are defined in one or more dielectric layers 1404. The conductive traces 1406 may be, e.g., a power plane, a signal trace, etc. One or more vias 1408 may connect conductive traces 1406. In the illustrative embodiment, the dielectric layer 1404 is a permanent dielectric layer onto which cold spray or other HTAM can be applied. In the illustrative embodiment, the dielectric layer 1404 may be, e.g., a fully cured epoxy material with silica or other fillers incorporated into it. Additionally or alternatively, any other suitable resin or polymer with or without one or more fillers may be used. The package substrate 1402 may be similar to the package substrate 102. The conductive traces 1406 may be similar to the conductive traces 104.

Figure 15:
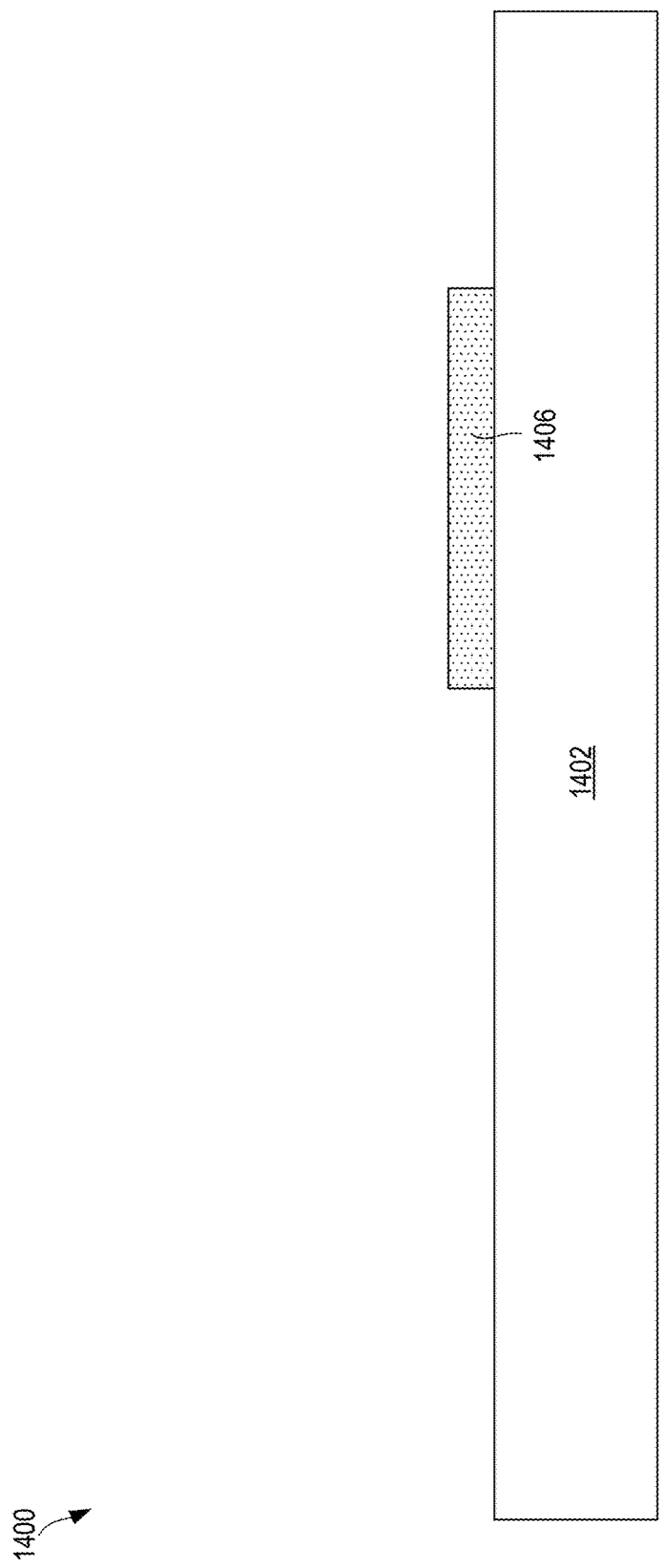
FIG. 15 illustrates an example system at one step of a method for creating the system of FIG. 14.

Referring now to FIG. 15, in one embodiment, in order to create the system 1400 shown in FIG. 14, conductive traces 1406 are patterned on a package substrate 1402. The conductive traces 1406 may be patterned using any suitable technique, such as photolithography.

Figure 16:
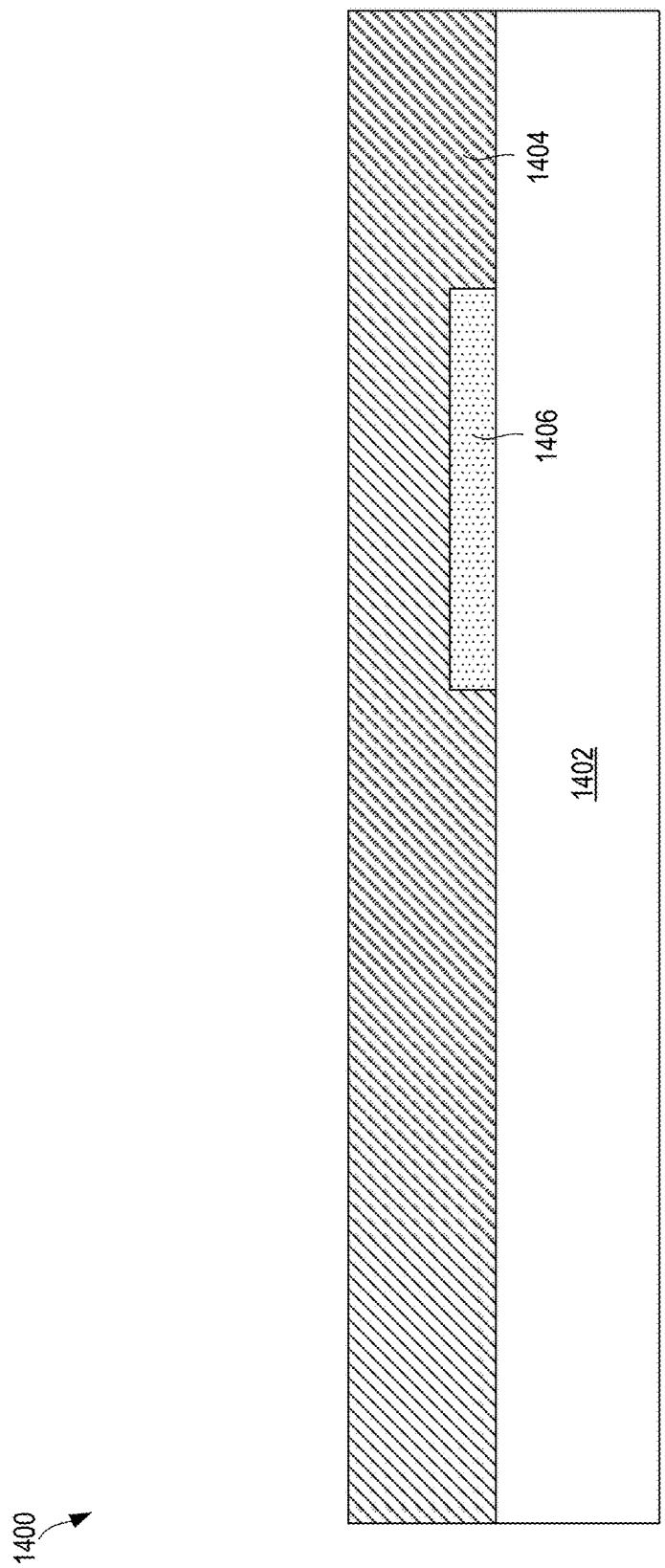
FIG. 16 illustrates an example system at one step of a method for creating the system of FIG. 14.

In FIG. 16, a permanent dielectric layer 1404 is deposited on the conductive traces 1406 and package substrate 1402. The permanent dielectric layer 1404 may be deposited by, e.g., hot press, vacuum lamination, a molding process, or any suitable process that can deposit the permanent dielectric layer 1404 onto the substrate 1402.

Figure 17:
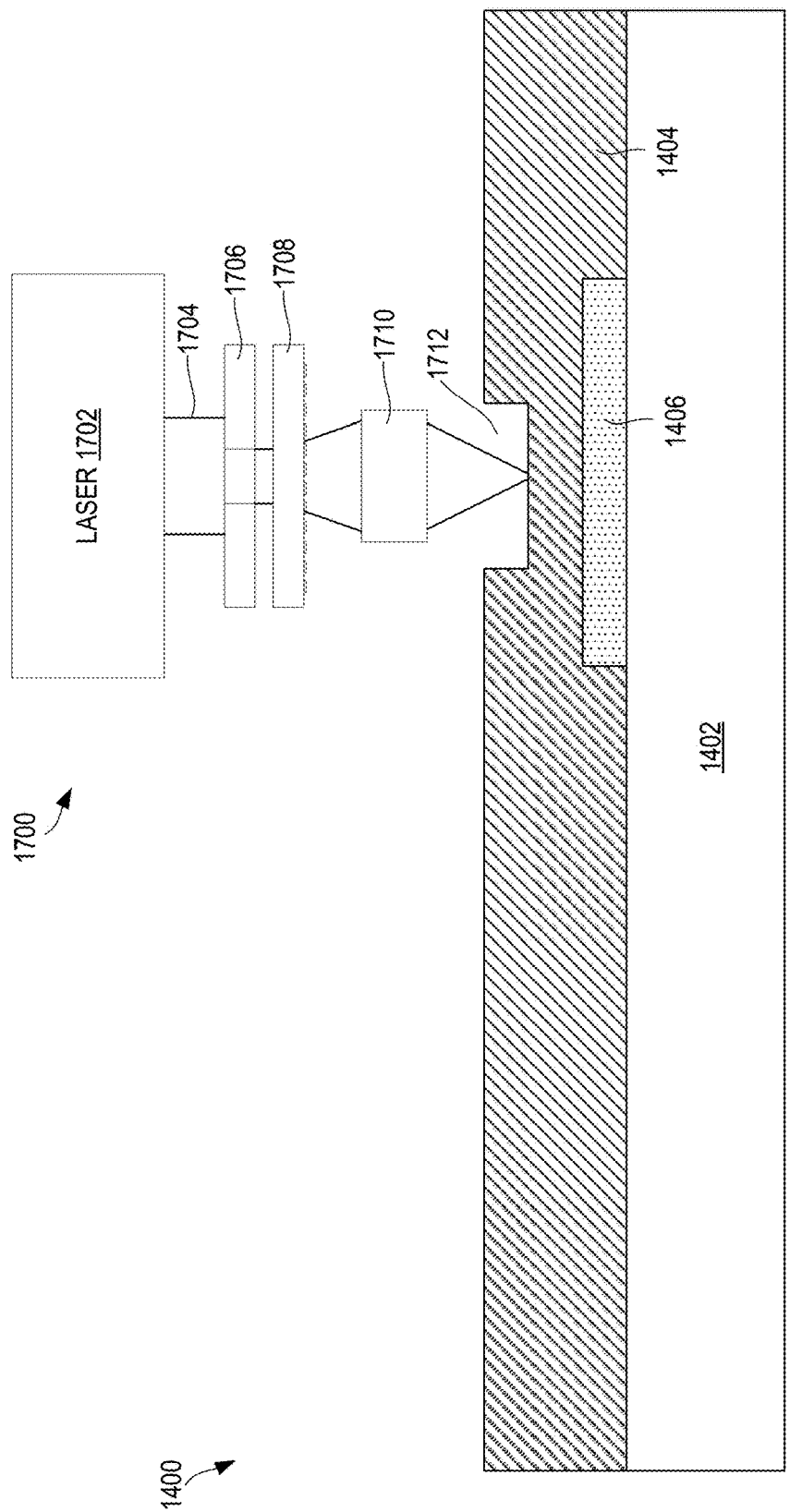
FIG. 17 illustrates an example system at one step of a method for creating the system of FIG. 14.

In FIG. 17, the permanent dielectric layer 1404 is patterned. As the illustrative permanent dielectric layer 1404 is not a photo definable material, trenches 1712 are patterned by physical processing without lithography. For example, in the illustrative embodiment, a laser project patterning (LPP) system 1700 is used to perform direct patterning to create the trenches 1712.

The illustrative LPP system 1700 includes a laser 1702 that outputs a laser beam 1704. The laser 1702 may be, e.g., an excimer or ultraviolet laser. The laser beam 1704 passes through a slit 1706 and a reticle 1708 and is then focused by a lens 1710 onto the permanent dielectric. The LPP system 1700 and/or the substrate 1402 can be scanned to focus the laser beam 1704 onto different parts of the permanent dielectric 1404.

In other embodiments, other processes may be used to define the trenches 1712. For example, nanoimprint lithography (in which a tool directly forms the desired pattern by mechanical force), inkjet printing of the permanent dielectric layer 1404, and/or injection molding may be used.

Figure 18:
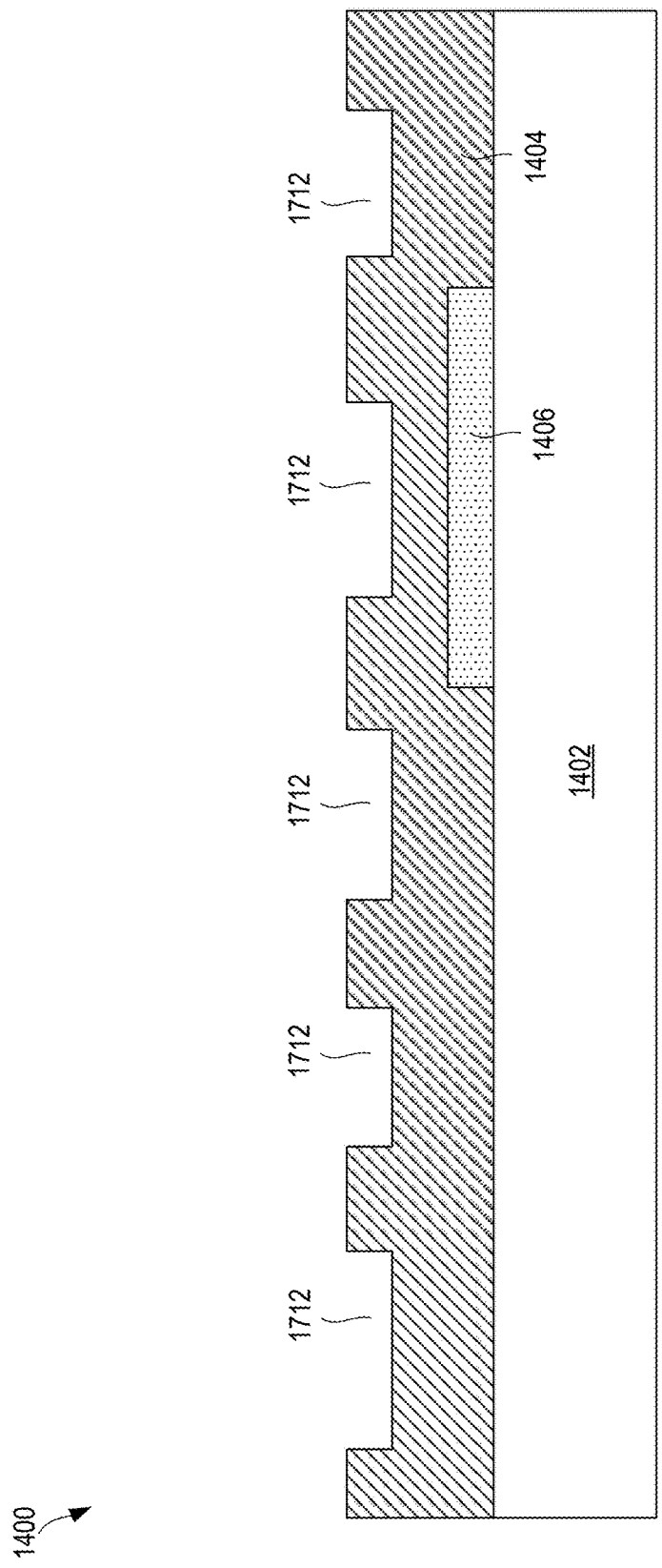
FIG. 18 illustrates an example system at one step of a method for creating the system of FIG. 14.
Figure 19:
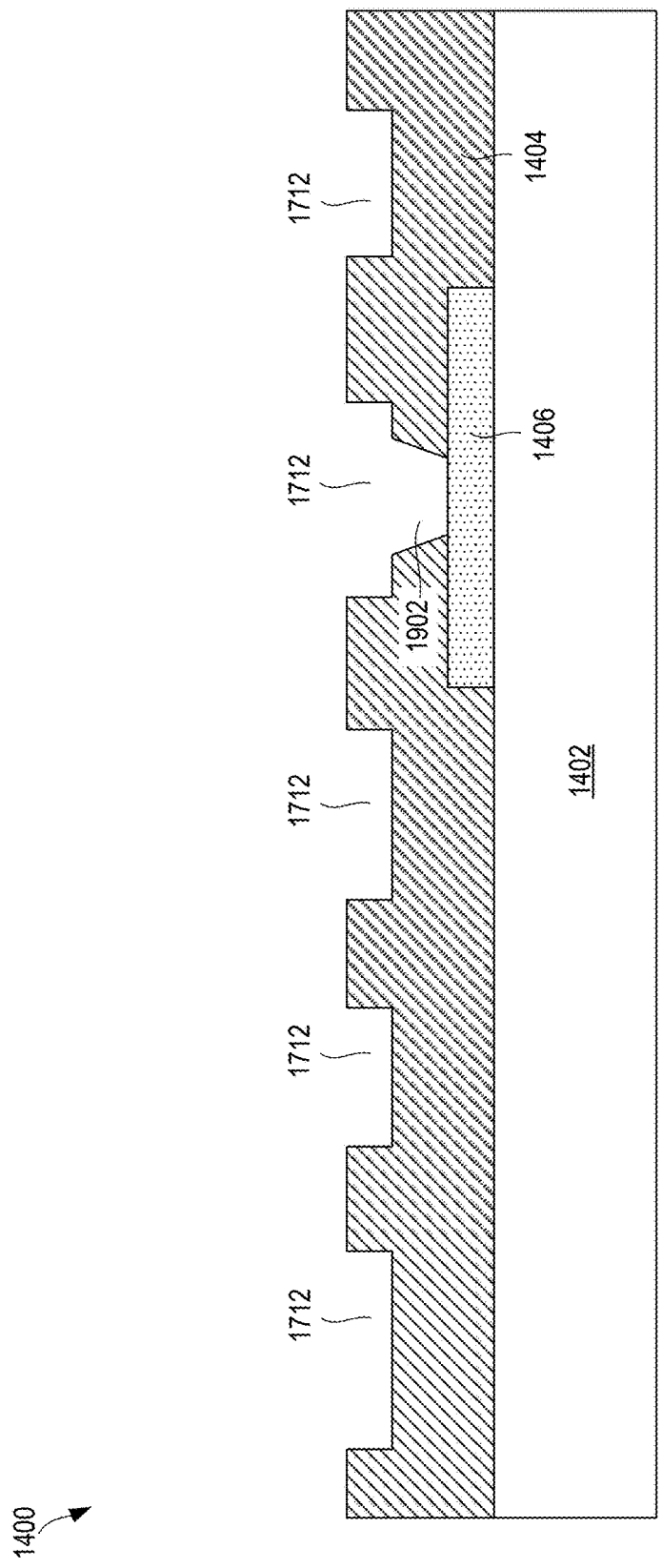
FIG. 19 illustrates an example system at one step of a method for creating the system of FIG. 14.

In some embodiments, a two-step process may be used to separately define the trenches 1712 and a via. For example, in one embodiment, a mask-based method may be used to define the trenches 1712 as shown in FIG. 18, and then a trench 1902 for a via 1408 may be drilled using a laser to form a connection to the conductive traces 1406 below, as shown in FIG. 19. This process may be done sequentially to the process in FIG. 17 or at the same time, e.g., by increasing the power of the laser or increasing the number of laser pulses at the via locations.

Figure 20:
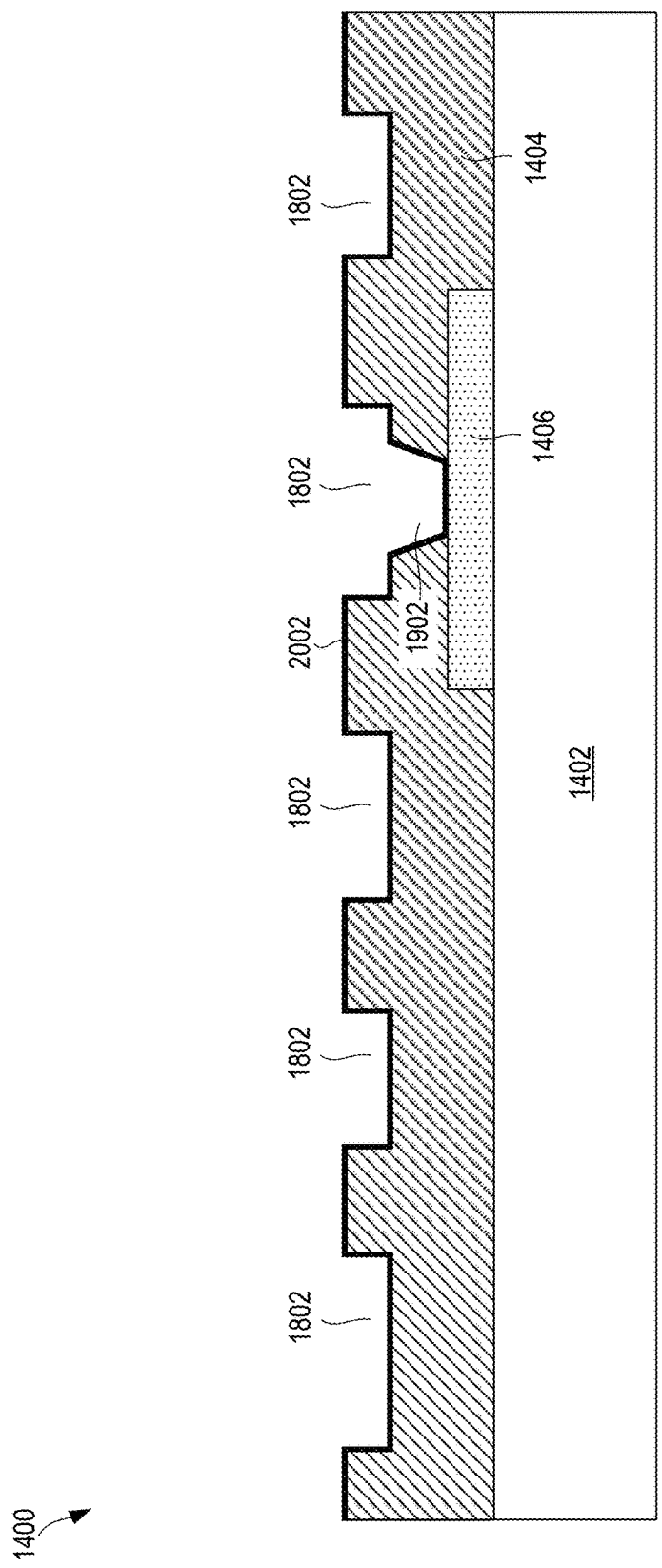
FIG. 20 illustrates an example system at one step of a method for creating the system of FIG. 14.

In some embodiments, a buffer layer 2002 may be added on top of the permanent dielectric layer 1404, as shown in FIG. 20. In other embodiments, cold spray or other HTAM material may be able to be applied directly to the permanent dielectric layer 1404. The buffer layer 2002 may be similar to the buffer layer 108.

Figure 21:
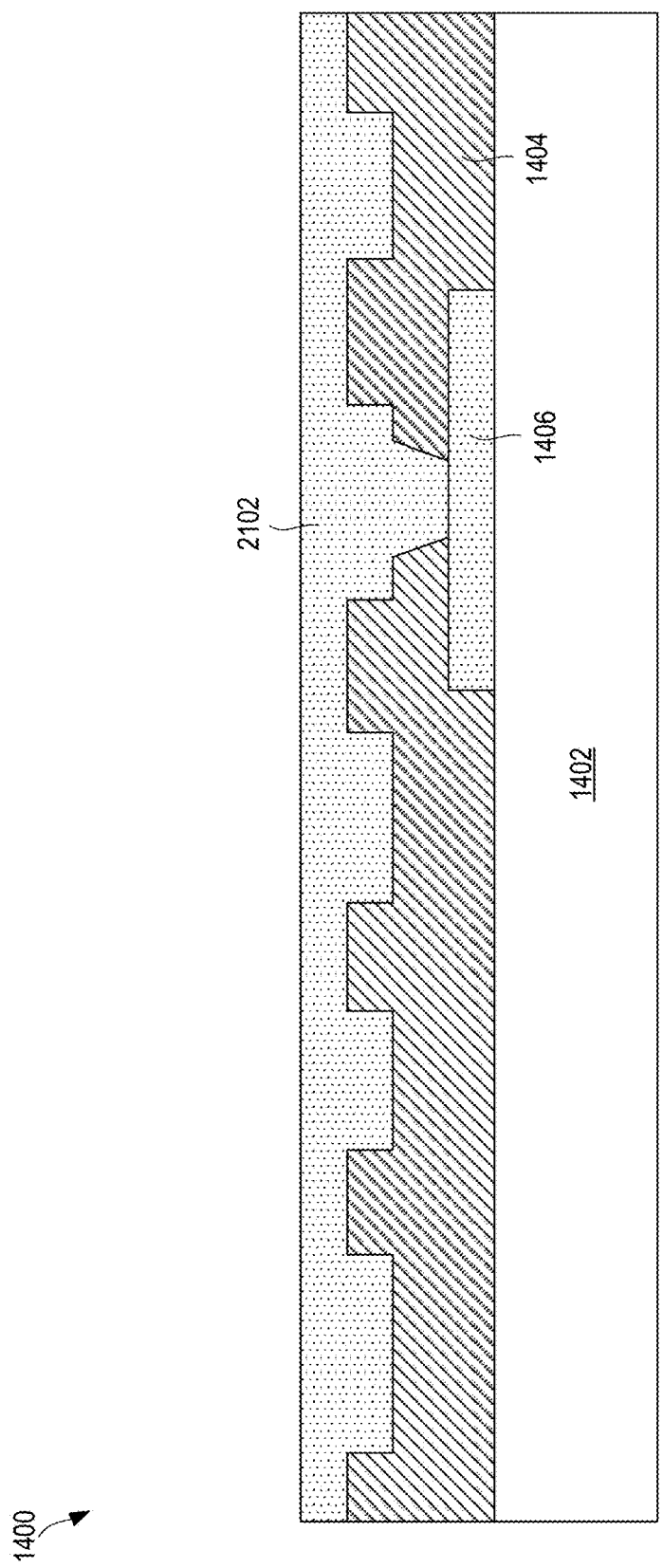
FIG. 21 illustrates an example system at one step of a method for creating the system of FIG. 14.

Referring now to FIG. 21, conductive traces 2102 are applied over the permanent dielectric layer 1404 (or over the buffer layer 2002) using cold spray or other HTAM technique. The conductive traces 2102 may be applied in a similar manner as the conductive traces 104 described above. The conductive traces 2102 can be planarized in a similar manner as described above, resulting in the system 1400 as shown in FIG. 14.

Figure 22:
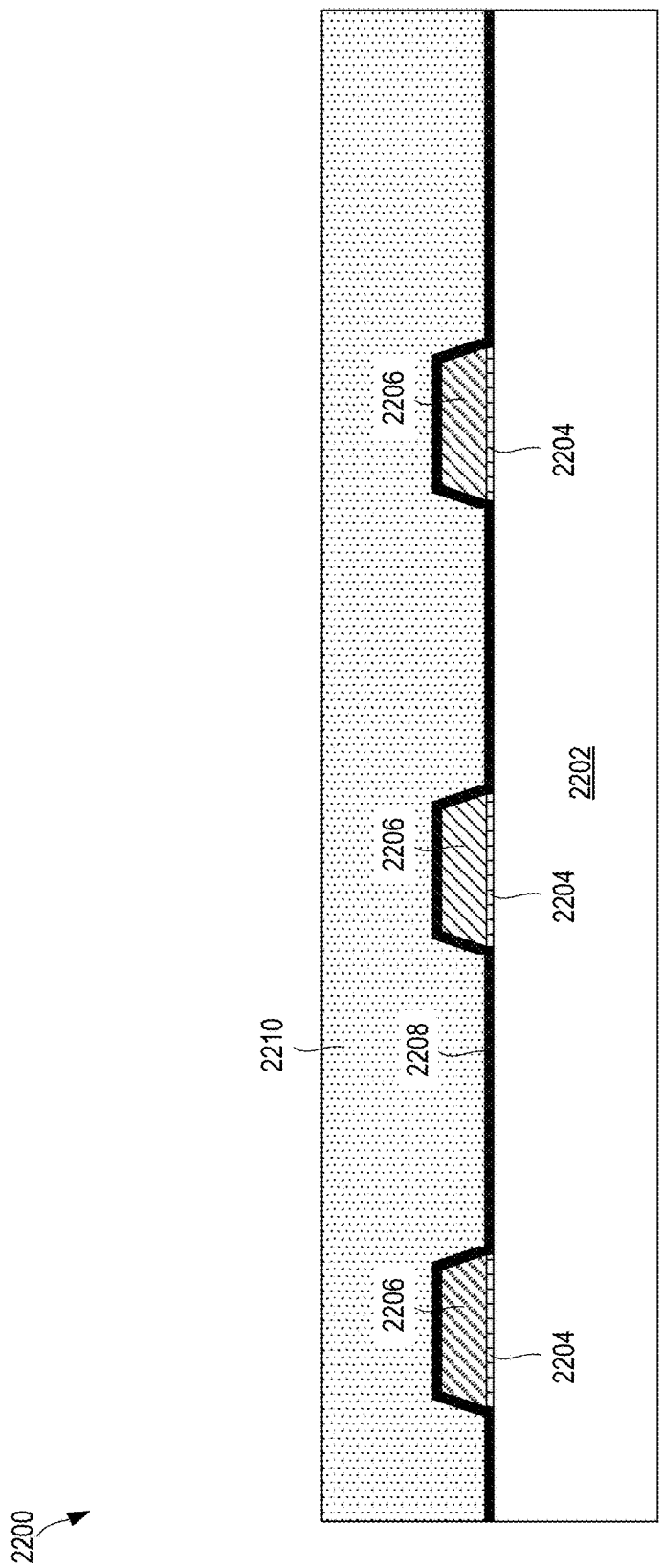
FIG. 22 illustrates an example system that includes a thick conductive trace in accordance with embodiments of the present disclosure.

Referring now to FIG. 22, in one embodiment, a system 2200 includes a package substrate 2202. One or more conductive traces 2206 are on the package substrate 2202. In the illustrative embodiment, a thin conductive film 2204 is between the conductive traces 2206 and the package substrate 2202. The thin conductive film 2204 may be the same material as the conductive traces 2206 or may be a different material. The thin conductive film 2204 may have any suitable thickness, such as 5-500 nanometers.

In the illustrative embodiment, the conductive traces 2206 have tapered sidewalls. The taper angle of the sidewalls of the conductive traces 2206 may have any suitable taper, such as 5-45°. The taper angle is defined such that a 0° angle corresponds to a straight sidewall that is normal to the surface of the substrate 2202.

A buffer stack 2208 is on top of the conductive traces 2206 and the package substrate 2202. In the illustrative embodiment, the buffer stack 2208 includes two or more layers. The buffer stack 2208 includes a dielectric layer to isolate the conductive layer 2210 from the conductive traces 2206, and the buffer stack 2208 includes a buffer layer to protect the layers underneath it when the conductive layer 2210 is applied using cold spray. The dielectric layer of the buffer stack 2208 may be, e.g., Si3N4, SiCN, TiO2, HfO2, SiO2, AlN, Al2O3, or other similar materials. The buffer layer of the buffer stack 2208 may be any material onto which copper or other suitable material can be applied by cold spray, such as titanium, tantalum, gold, nickel, vanadium, silver, or copper.

In some embodiments, the buffer stack 2208 may only include the buffer layer on which copper or other material can be cold sprayed. In some areas, such as between the conductive traces 2206 and the conductive layer 2210, a dielectric layer is needed to electrically isolate the layers on either side of the buffer stack. However, in some places, an electrical connection may be desirable or needed. For example, some areas of the substrate 2202 may require a connection to the conductive layer 2210, in which case a dielectric layer should not be used. Instead, a buffer layer 2208 without a dielectric layer can be used. This may be done through an etch step to remove the dielectric in the areas that is not needed or through a masking step when depositing the dielectric to not get the dielectric deposited in masked locations.

A conductive layer 2210 is on top of the buffer stack 2208. The conductive layer 2210 may be similar to the conductive trace 104.

Figure 23:
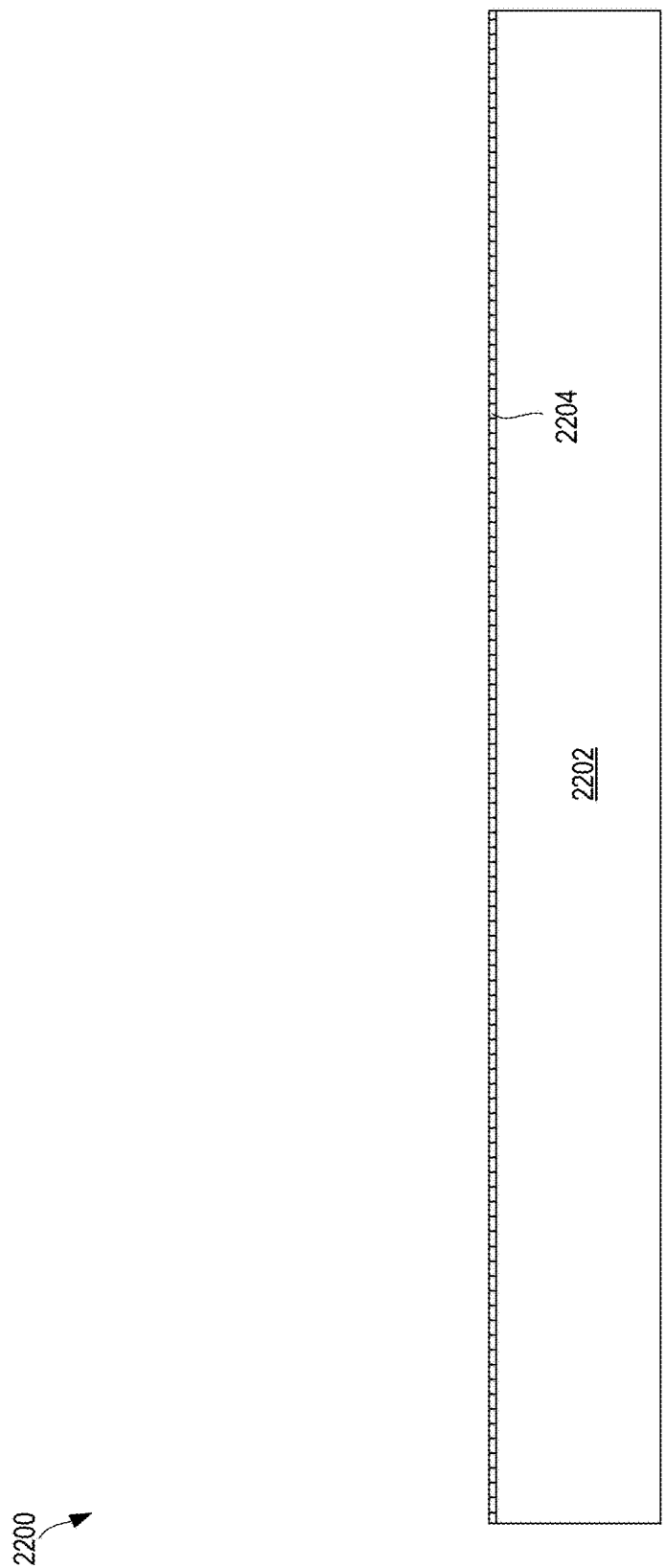
FIG. 23 illustrates an example system at one step of a method for creating the system of FIG. 22.
Figure 24:
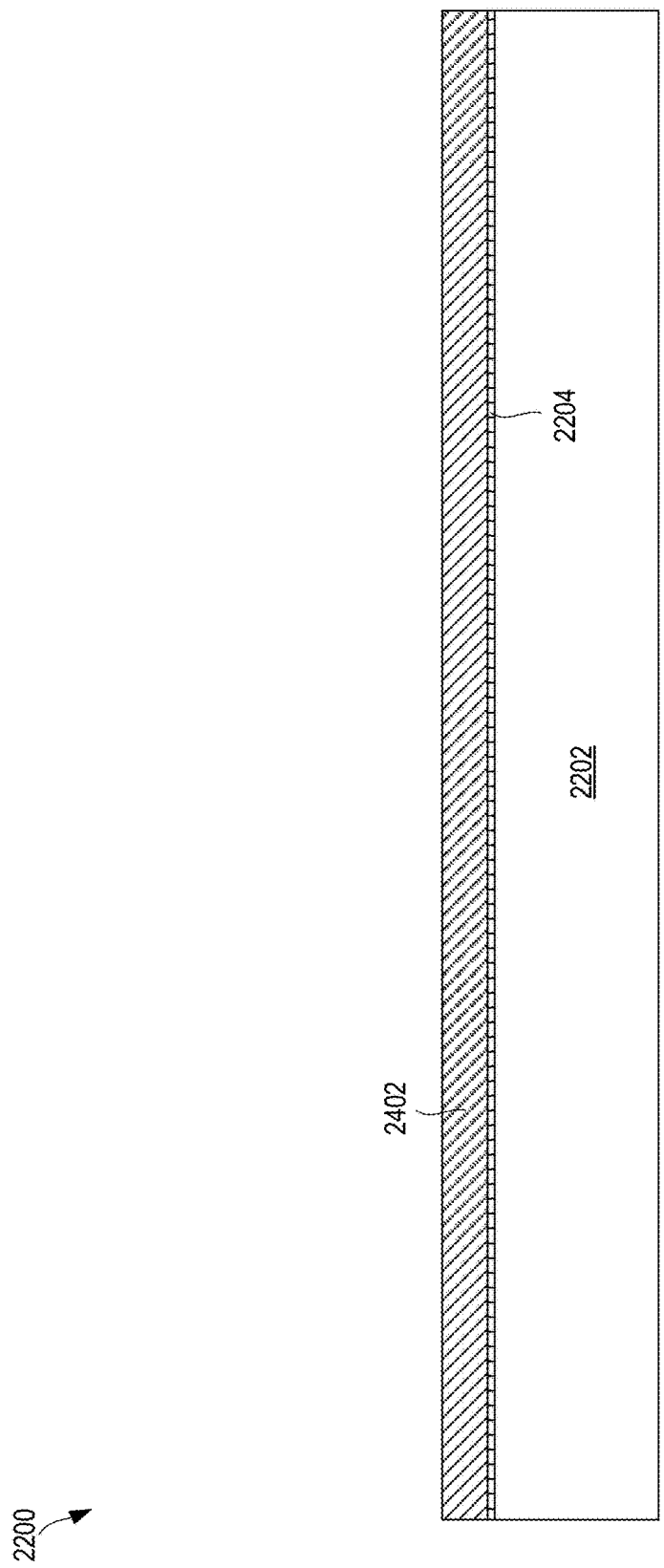
FIG. 24 illustrates an example system at one step of a method for creating the system of FIG. 22.

Referring now to FIG. 23, in one embodiment, in order to create the system 2200 shown in FIG. 22, a thin seed layer 2204 is patterned on a package substrate 2202. The seed layer 2204 may be, e.g., copper or other barrier metal. The seed layer 2204 may be patterned using any suitable technology, such as chemical vapor deposition, plasma enhanced chemical vapor deposition, atomic layer deposition, electroless plating, etc. A conductive trace 2402 is then deposited on the seed layer 2204, as shown in FIG. 24. The conductive trace 2402 may be deposited using any suitable technique, such as electroplating or cold spray.

Figure 25:
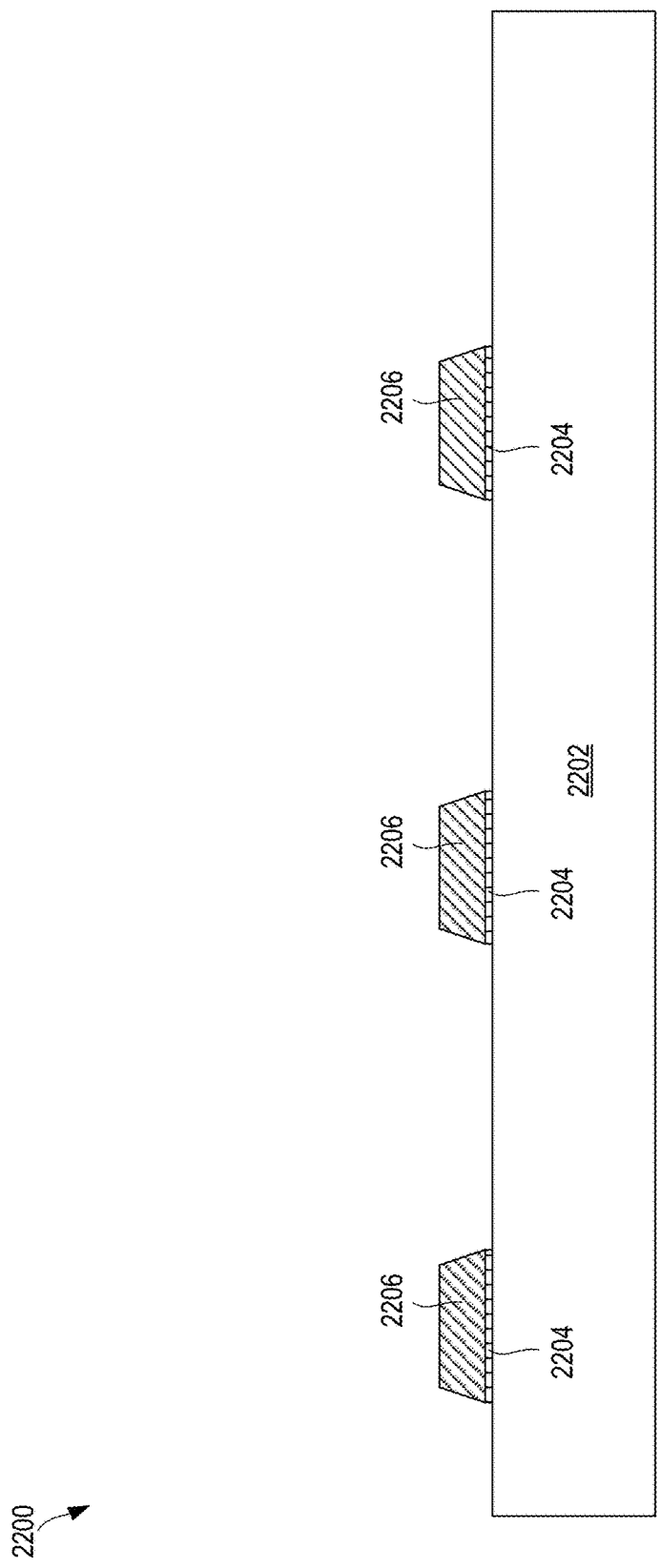
FIG. 25 illustrates an example system at one step of a method for creating the system of FIG. 22.

The conductive traces 2206 are then patterned from the conductive trace 2402 using subtractive manufacturing, as shown in FIG. 25. The conductive traces 2206 may be patterned using any suitable technique, such as chemical etching with a mask. The taper of the conductive traces 2206 may be selected based on, e.g., improving coverage of the buffer stack 2208, thickness uniformity, and fine line and space capability for the resulting conductive trace 2206.

Figure 26:
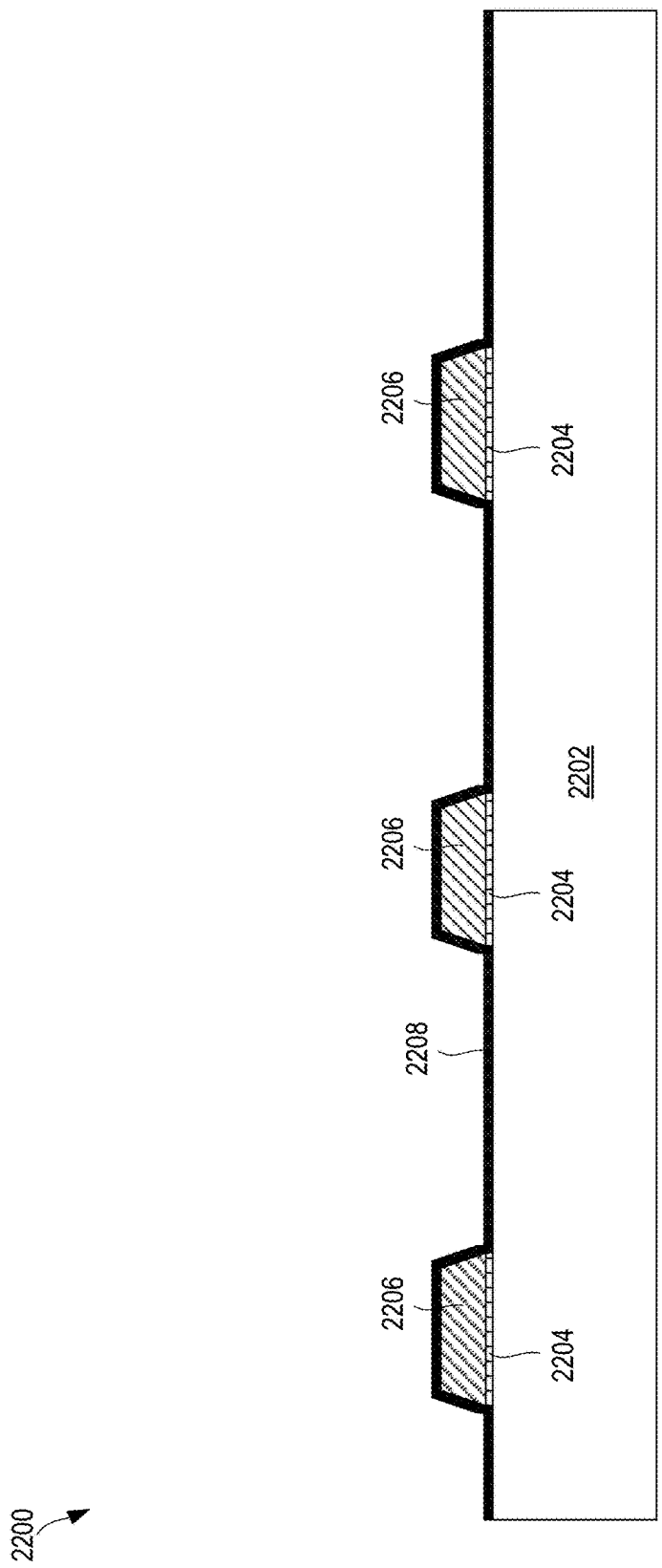
FIG. 26 illustrates an example system at one step of a method for creating the system of FIG. 22.

The buffer stack 2208 is then deposited on the conductive traces 2206 and the package substrate 2202, as shown in FIG. 26. A dielectric layer is first deposited, such as silicon oxide, silicon nitride, etc. A buffer layer is then deposited on the dielectric layer, such as titanium, copper, nickel, vanadium, silver, gold, etc. In some embodiments, the taper of the conductive traces 2206 improves the characteristics of the buffer stack 2208, such as uniformity, lack of gaps, etc. The conductive layer 2210 is then deposited on the buffer stack 2208, resulting in the system 2200 as shown in FIG. 22. The conductive layer 2210 may be deposited using cold spray or other HTAM technique.

Figure 27:
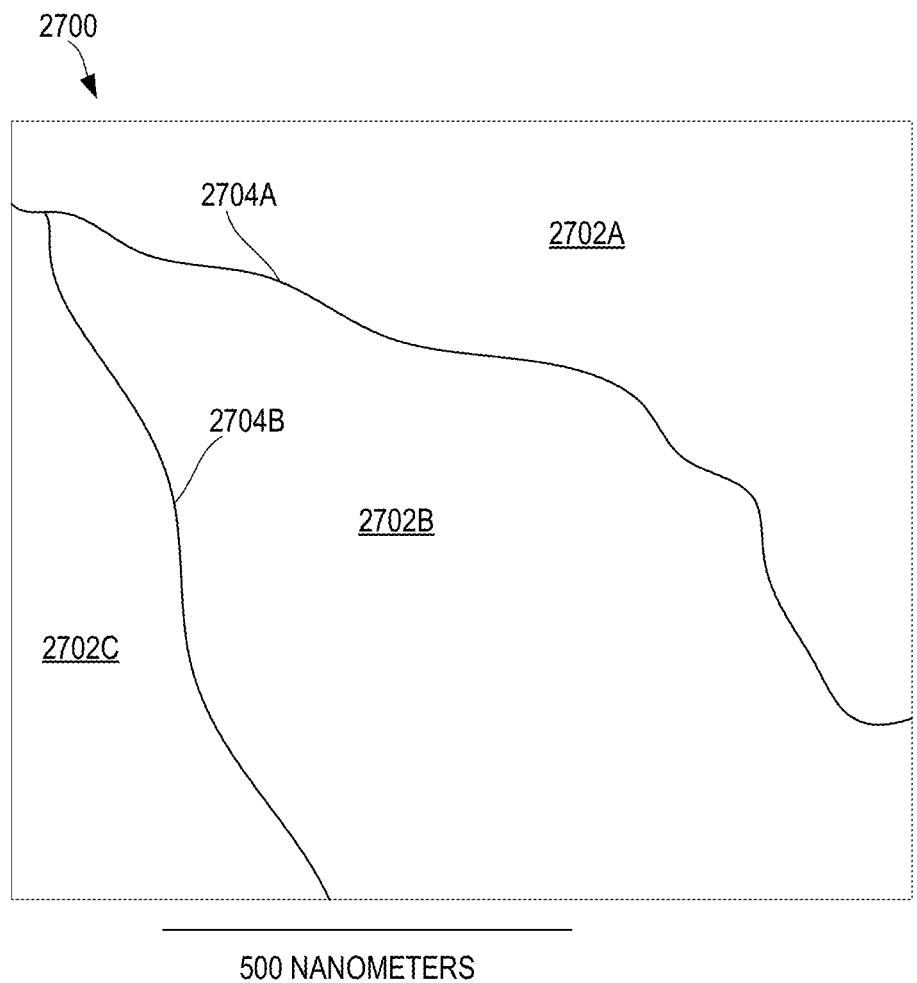
FIG. 27 illustrates one embodiment of a high-magnification cross-section of a cold spray structure.

Referring now to FIG. 27, in one embodiment, an illustration 2700 of a magnified view of a cold spray structure (such as the conductive trace 104) is shown. The illustration 2700 has a scale in the form of a line at the bottom, which has a width of 500 nanometers. The illustration shows several grains 2702, such as grain 2702A, grain 2702B, and grain 2702C. Cold spray structures such as the one illustrated in FIG. 27 include a non-amorphous, granular microstructure including disordered or randomly distributed grains or particles. In the illustrative embodiment, each grain 2702A-C has a length, width, height, and/or diameter of, e.g., 10-100 micrometers. Grain boundaries (such as grain boundary 2704A, 2704B) are present between the various grains 2702A-C. The grain boundaries are visible in, e.g., a scanning electron microscope image taken of a cross-section of a cold spray structure. A cold spray structure may have a maximum porosity of 5% throughout.

It should be appreciated that, in some embodiments, the various techniques disclosed herein may be used together. For example, one layer of a structure may be created using sacrificial dielectric trace, one layer of the structure may be created using a permanent dielectric, and one layer of the structure may be created using conductive traces with tapered sidewalls.

Figure 28:
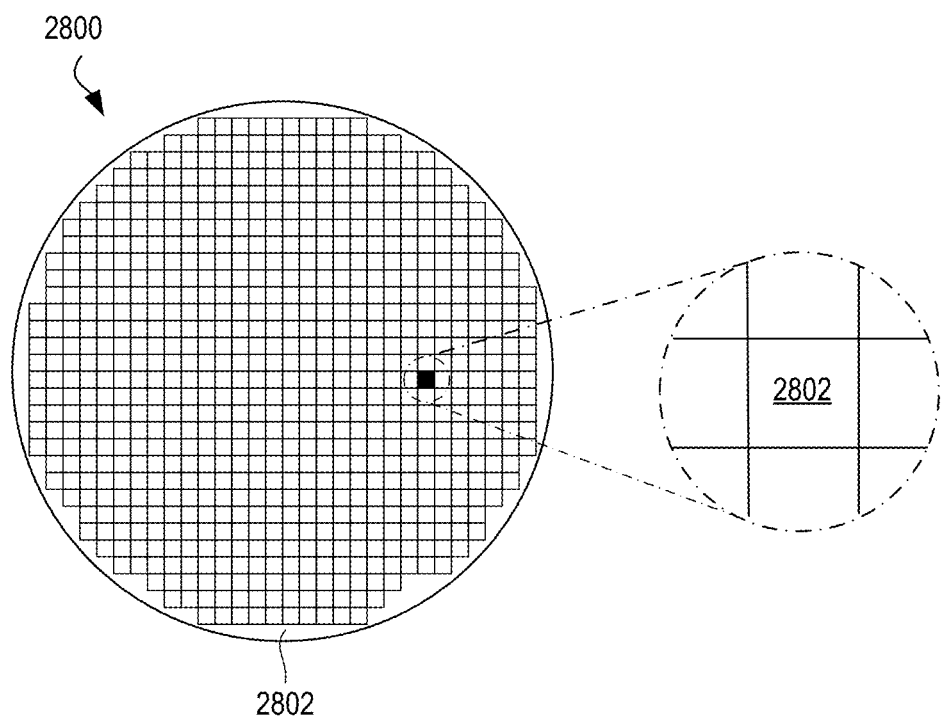
FIG. 28 is a top view of a wafer and dies that may be included in a microelectronic assembly, in accordance with any of the embodiments disclosed herein.

FIG. 28 is a top view of a wafer 2800 and dies 2802 that may include any of the HTAM structures disclosed herein. The wafer 2800 may be composed of semiconductor material and may include one or more dies 2802 having integrated circuit structures formed on a surface of the wafer 2800. The individual dies 2802 may be a repeating unit of an integrated circuit product that includes any suitable integrated circuit. After the fabrication of the semiconductor product is complete, the wafer 2800 may undergo a singulation process in which the dies 2802 are separated from one another to provide discrete "chips" of the integrated circuit product. The die 2802 may include one or more transistors (e.g., some of the transistors 2940 of FIG. 29, discussed below), supporting circuitry to route electrical signals to the transistors, passive components (e.g., signal traces, resistors, capacitors, or inductors), and/or any other integrated circuit components. In some embodiments, the wafer 2800 or the die 2802 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 2802. For example, a memory array formed by multiple memory devices may be formed on a same die 2802 as a processor unit (e.g., the processor unit 3202 of FIG. 32) or other logic that is configured to store information in the memory devices or execute instructions stored in the memory array. Various embodiments disclosed herein may be manufactured using a die-to-wafer assembly technique in which some dies are attached to a wafer 2800 that include others of the dies, and the wafer 2800 is subsequently singulated.

Figure 29:
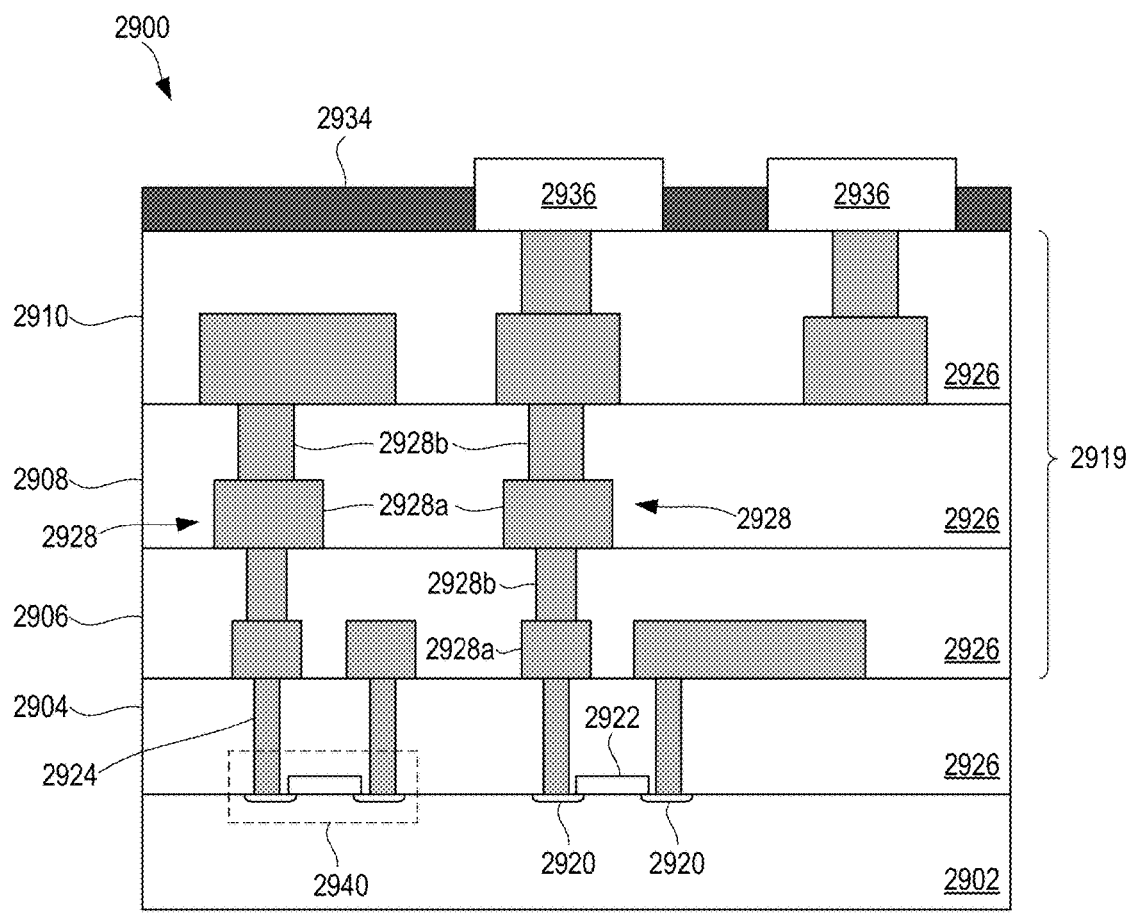
FIG. 29 is a cross-sectional side view of an integrated circuit device that may be included in a microelectronic assembly, in accordance with any of the embodiments disclosed herein.

FIG. 29 is a cross-sectional side view of an integrated circuit device 2900 that may include any of the HTAM structures disclosed herein. One or more of the integrated circuit devices 2900 may be included in one or more dies 2802 (FIG. 28). The integrated circuit device 2900 may be formed on a die substrate 2902 (e.g., the wafer 2800 of FIG. 28) and may be included in a die (e.g., the die 2802 of FIG. 28). The die substrate 2902 may be a semiconductor substrate composed of semiconductor material systems including, for example, n-type or p-type materials systems (or a combination of both). The die substrate 2902 may include, for example, a crystalline substrate formed using a bulk silicon or a silicon-on-insulator (SOI) substructure. In some embodiments, the die substrate 2902 may be formed using alternative materials, which may or may not be combined with silicon, that include, but are not limited to, germanium, indium antimonide, lead telluride, indium arsenide, indium phosphide, gallium arsenide, or gallium antimonide. Further materials classified as group II-VI, III-V, or IV may also be used to form the die substrate 2902. Although a few examples of materials from which the die substrate 2902 may be formed are described here, any material that may serve as a foundation for an integrated circuit device 2900 may be used. The die substrate 2902 may be part of a singulated die (e.g., the dies 2802 of FIG. 28) or a wafer (e.g., the wafer 2800 of FIG. 28).

The integrated circuit device 2900 may include one or more device layers 2904 disposed on the die substrate 2902. The device layer 2904 may include features of one or more transistors 2940 (e.g., metal oxide semiconductor field-effect transistors (MOSFETs)) formed on the die substrate 2902. The transistors 2940 may include, for example, one or more source and/or drain (S/D) regions 2920, a gate 2922 to control current flow between the S/D regions 2920, and one or more S/D contacts 2924 to route electrical signals to/from the S/D regions 2920. The transistors 2940 may include additional features not depicted for the sake of clarity, such as device isolation regions, gate contacts, and the like. The transistors 2940 are not limited to the type and configuration depicted in FIG. 29 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon, nanosheet, or nanowire transistors.

FIGS. 30A-30D are simplified perspective views of example planar, FinFET, gate-all-around, and stacked gate-all-around transistors. The transistors illustrated in FIGS. 30A-30D are formed on a substrate 3016 having a surface 3008. Isolation regions 3014 separate the source and drain regions of the transistors from other transistors and from a bulk region 3018 of the substrate 3016.

Figure 30B:
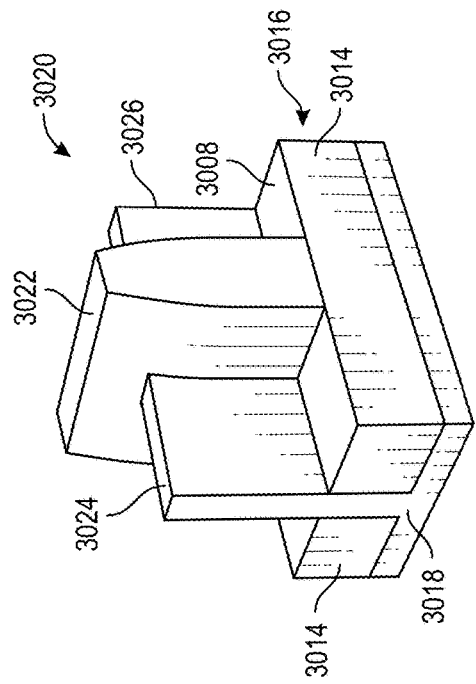
FIGS. 30A-30D are perspective views of example planar, gate-all-around, and stacked gate-all-around transistors.
Figure 30D:
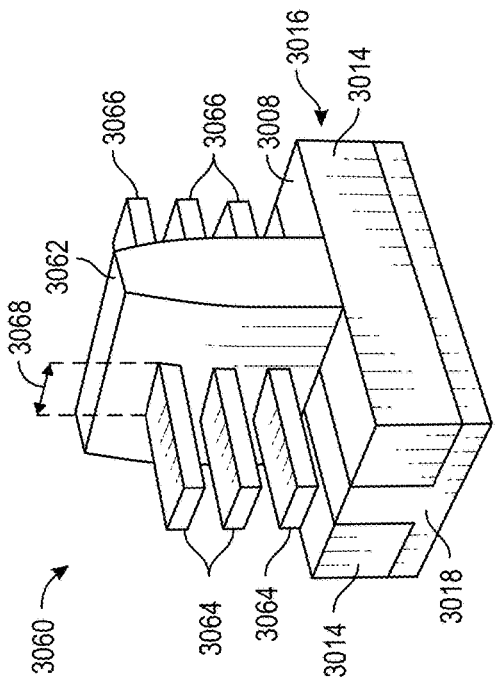
Figure 30A:
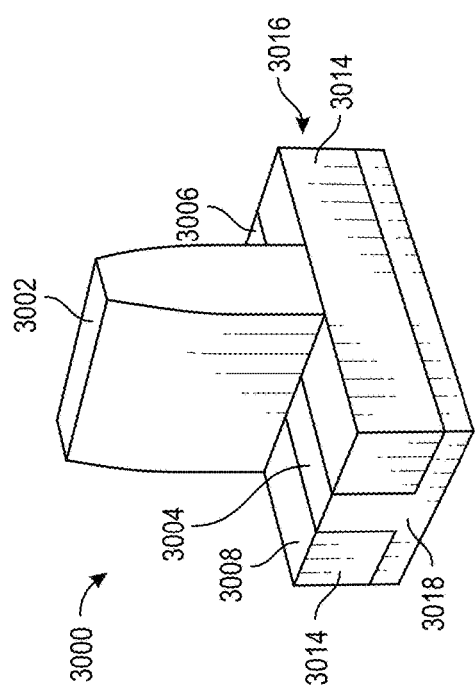

FIG. 30A is a perspective view of an example planar transistor 3000 comprising a gate 3002 that controls current flow between a source region 3004 and a drain region 3006. The transistor 3000 is planar in that the source region 3004 and the drain region 3006 are planar with respect to the substrate surface 3008.

FIG. 30B is a perspective view of an example FinFET transistor 3020 comprising a gate 3022 that controls current flow between a source region 3024 and a drain region 3026.

The transistor 3020 is non-planar in that the source region 3024 and the drain region 3026 comprise "fins" that extend upwards from the substrate surface 3028. As the gate 3022 encompasses three sides of the semiconductor fin that extends from the source region 3024 to the drain region 3026, the transistor 3020 can be considered a tri-gate transistor. FIG. 30B illustrates one S/D fin extending through the gate 3022, but multiple S/D fins can extend through the gate of a FinFET transistor.

Figure 30C:
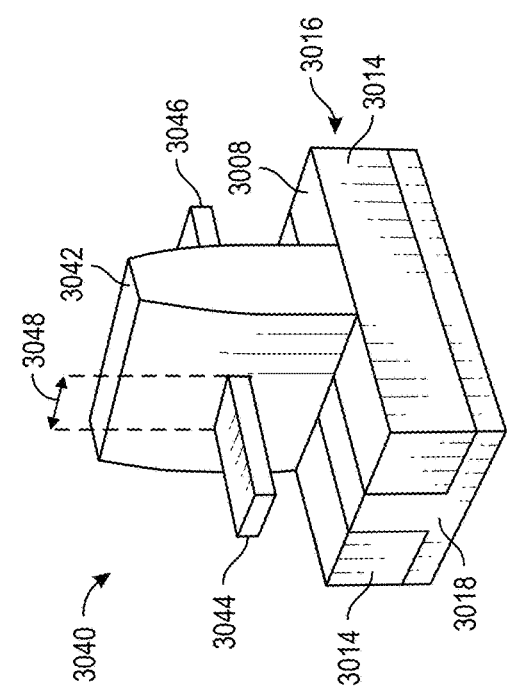

FIG. 30C is a perspective view of a gate-all-around (GAA) transistor 3040 comprising a gate 3042 that controls current flow between a source region 3044 and a drain region 3046. The transistor 3040 is non-planar in that the source region 3044 and the drain region 3046 are elevated from the substrate surface 3028.

FIG. 30D is a perspective view of a GAA transistor 3060 comprising a gate 3062 that controls current flow between multiple elevated source regions 3064 and multiple elevated drain regions 3066. The transistor 3060 is a stacked GAA transistor as the gate controls the flow of current between multiple elevated S/D regions stacked on top of each other. The transistors 3040 and 3060 are considered gate-all-around transistors as the gates encompass all sides of the semiconductor portions that extends from the source regions to the drain regions. The transistors 3040 and 3060 can alternatively be referred to as nanowire, nanosheet, or nanoribbon transistors depending on the width (e.g., widths 3048 and 3068 of transistors 3040 and 3060, respectively) of the semiconductor portions extending through the gate.

Returning to FIG. 29, a transistor 2940 may include a gate 2922 formed of at least two layers, a gate dielectric and a gate electrode. The gate dielectric may include one layer or a stack of layers. The one or more layers may include silicon oxide, silicon dioxide, silicon carbide, and/or a high-k dielectric material.

The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 2940 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 2940 along the source-channel-drain direction, the gate electrode may consist of a U-shaped structure that includes a bottom portion substantially parallel to the surface of the die substrate 2902 and two sidewall portions that are substantially perpendicular to the top surface of the die substrate 2902. In other embodiments, at least one of the metal layers that form the gate electrode may simply be a planar layer that is substantially parallel to the top surface of the die substrate 2902 and does not include sidewall portions substantially perpendicular to the top surface of the die substrate 2902. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 2920 may be formed within the die substrate 2902 adjacent to the gate 2922 of individual transistors 2940. The S/D regions 2920 may be formed using an implantation/diffusion process or an etching/deposition process, for example. In the former process, dopants such as boron, aluminum, antimony, phosphorous, or arsenic may be ion-implanted into the die substrate 2902 to form the S/D regions 2920. An annealing process that activates the dopants and causes them to diffuse farther into the die substrate 2902 may follow the ion-implantation process. In the latter process, the die substrate 2902 may first be etched to form recesses at the locations of the S/D regions 2920. An epitaxial deposition process may then be carried out to fill the recesses with material that is used to fabricate the S/D regions 2920. In some implementations, the S/D regions 2920 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 2920 may be formed using one or more alternate semiconductor materials such as germanium or a group III-V material or alloy. In further embodiments, one or more layers of metal and/or metal alloys may be used to form the S/D regions 2920.

Electrical signals, such as power and/or input/output (I/O) signals, may be routed to and/or from the devices (e.g., transistors 2940) of the device layer 2904 through one or more interconnect layers disposed on the device layer 2904 (illustrated in FIG. 29 as interconnect layers 2906-2910). For example, electrically conductive features of the device layer 2904 (e.g., the gate 2922 and the S/D contacts 2924) may be electrically coupled with the interconnect structures 2928 of the interconnect layers 2906-2910. The one or more interconnect layers 2906-2910 may form a metallization stack (also referred to as an "ILD stack") 2919 of the integrated circuit device 2900.

The interconnect structures 2928 may be arranged within the interconnect layers 2906-2910 to route electrical signals according to a wide variety of designs; in particular, the arrangement is not limited to the particular configuration of interconnect structures 2928 depicted in FIG. 29. Although a particular number of interconnect layers 2906-2910 is depicted in FIG. 29, embodiments of the present disclosure include integrated circuit devices having more or fewer interconnect layers than depicted.

In some embodiments, the interconnect structures 2928 may include lines 2928a and/or vias 2928b filled with an electrically conductive material such as a metal. The lines 2928a may be arranged to route electrical signals in a direction of a plane that is substantially parallel with a surface of the die substrate 2902 upon which the device layer 2904 is formed. For example, the lines 2928a may route electrical signals in a direction in and out of the page and/or in a direction across the page from the perspective of FIG. 13. The vias 2928b may be arranged to route electrical signals in a direction of a plane that is substantially perpendicular to the surface of the die substrate 2902 upon which the device layer 2904 is formed. In some embodiments, the vias 2928b may electrically couple lines 2928a of different interconnect layers 2906-2910 together.

The interconnect layers 2906-2910 may include a dielectric material 2926 disposed between the interconnect structures 2928, as shown in FIG. 29. In some embodiments, dielectric material 2926 disposed between the interconnect structures 2928 in different ones of the interconnect layers 2906-2910 may have different compositions; in other embodiments, the composition of the dielectric material 2926 between different interconnect layers 2906-2910 may be the same. The device layer 2904 may include a dielectric material 2926 disposed between the transistors 2940 and a bottom layer of the metallization stack as well. The dielectric material 2926 included in the device layer 2904 may have a different composition than the dielectric material 2926 included in the interconnect layers 2906-2910; in other embodiments, the composition of the dielectric material 2926 in the device layer 2904 may be the same as a dielectric material 2926 included in any one of the interconnect layers 2906-2910.

A first interconnect layer 2906 (referred to as Metal 1 or "M1") may be formed directly on the device layer 2904. In some embodiments, the first interconnect layer 2906 may include lines 2928a and/or vias 2928b, as shown. The lines 2928a of the first interconnect layer 2906 may be coupled with contacts (e.g., the S/D contacts 2924) of the device layer 2904. The vias 2928b of the first interconnect layer 2906 may be coupled with the lines 2928a of a second interconnect layer 2908.

The second interconnect layer 2908 (referred to as Metal 2 or "M2") may be formed directly on the first interconnect layer 2906. In some embodiments, the second interconnect layer 2908 may include via 2928b to couple the lines 2928 of the second interconnect layer 2908 with the lines 2928a of a third interconnect layer 2910. Although the lines 2928a and the vias 2928b are structurally delineated with a line within individual interconnect layers for the sake of clarity, the lines 2928a and the vias 2928b may be structurally and/or materially contiguous (e.g., simultaneously filled during a dual-damascene process) in some embodiments.

The third interconnect layer 2910 (referred to as Metal 3 or "M3") (and additional interconnect layers, as desired) may be formed in succession on the second interconnect layer 2908 according to similar techniques and configurations described in connection with the second interconnect layer 2908 or the first interconnect layer 2906. In some embodiments, the interconnect layers that are "higher up" in the metallization stack 2919 in the integrated circuit device 2900 (i.e., farther away from the device layer 2904) may be thicker that the interconnect layers that are lower in the metallization stack 2919, with lines 2928a and vias 2928b in the higher interconnect layers being thicker than those in the lower interconnect layers.

The integrated circuit device 2900 may include a solder resist material 2934 (e.g., polyimide or similar material) and one or more conductive contacts 2936 formed on the interconnect layers 2906-2910. In FIG. 29, the conductive contacts 2936 are illustrated as taking the form of bond pads. The conductive contacts 2936 may be electrically coupled with the interconnect structures 2928 and configured to route the electrical signals of the transistor(s) 2940 to external devices. For example, solder bonds may be formed on the one or more conductive contacts 2936 to mechanically and/or electrically couple an integrated circuit die including the integrated circuit device 2900 with another component (e.g., a printed circuit board). The integrated circuit device 2900 may include additional or alternate structures to route the electrical signals from the interconnect layers 2906-2910; for example, the conductive contacts 2936 may include other analogous features (e.g., posts) that route the electrical signals to external components.

In some embodiments in which the integrated circuit device 2900 is a double-sided die, the integrated circuit device 2900 may include another metallization stack (not shown) on the opposite side of the device layer(s) 2904. This metallization stack may include multiple interconnect layers as discussed above with reference to the interconnect layers 2906-2910, to provide conductive pathways (e.g., including conductive lines and vias) between the device layer(s) 2904 and additional conductive contacts (not shown) on the opposite side of the integrated circuit device 2900 from the conductive contacts 2936.

In other embodiments in which the integrated circuit device 2900 is a double-sided die, the integrated circuit device 2900 may include one or more through silicon vias (TSVs) through the die substrate 2902; these TSVs may make contact with the device layer(s) 2904, and may provide conductive pathways between the device layer(s) 2904 and additional conductive contacts (not shown) on the opposite side of the integrated circuit device 2900 from the conductive contacts 2936. In some embodiments, TSVs extending through the substrate can be used for routing power and ground signals from conductive contacts on the opposite side of the integrated circuit device 2900 from the conductive contacts 2936 to the transistors 2940 and any other components integrated into the die 2900, and the metallization stack 2919 can be used to route I/O signals from the conductive contacts 2936 to transistors 2940 and any other components integrated into the die 2900.

Multiple integrated circuit devices 2900 may be stacked with one or more TSVs in the individual stacked devices providing connection between one of the devices to any of the other devices in the stack. For example, one or more high-bandwidth memory (HBM) integrated circuit dies can be stacked on top of a base integrated circuit die and TSVs in the HBM dies can provide connection between the individual HBM and the base integrated circuit die. Conductive contacts can provide additional connections between adjacent integrated circuit dies in the stack. In some embodiments, the conductive contacts can be fine-pitch solder bumps (microbumps).

Figure 31:
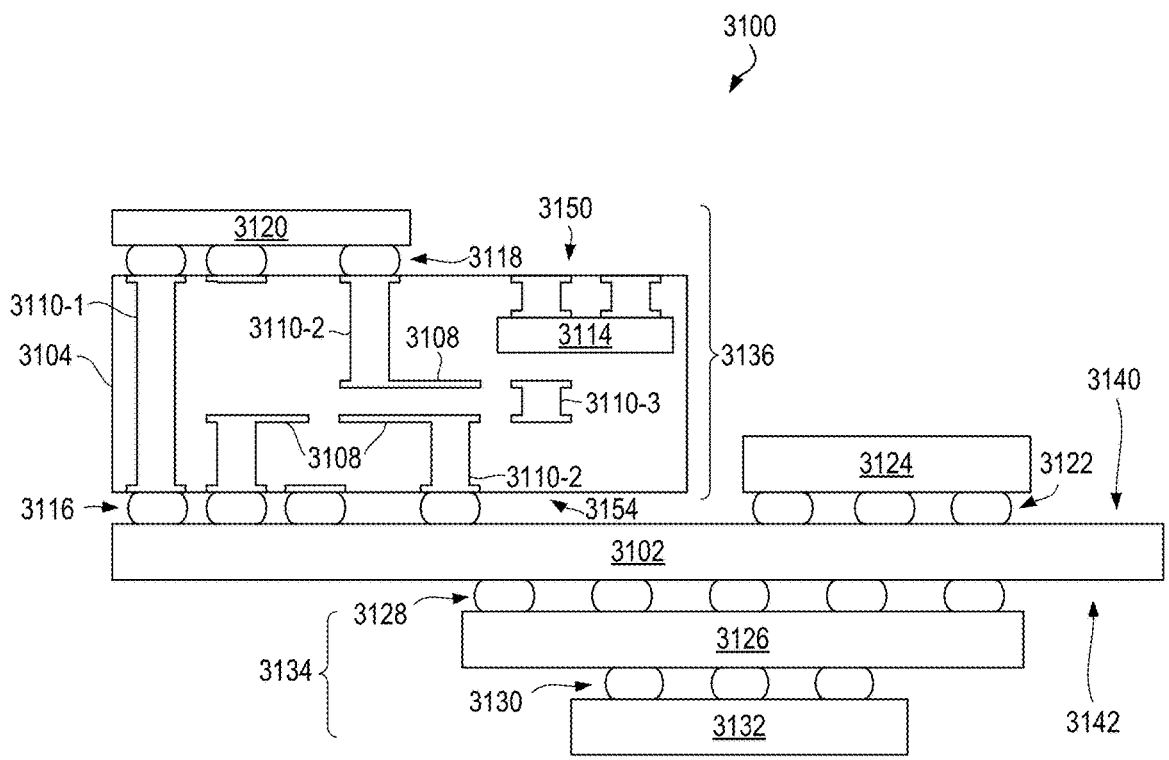
FIG. 31 is a cross-sectional side view of an integrated circuit device assembly that may include a microelectronic assembly, in accordance with any of the embodiments disclosed herein.

FIG. 31 is a cross-sectional side view of an integrated circuit device assembly 3100 that may include any of the HTAM structures disclosed herein. In some embodiments, the integrated circuit device assembly 3100 may be a microelectronic assembly. The integrated circuit device assembly 3100 includes a number of components disposed on a circuit board 3102 (which may be a motherboard, system board, mainboard, etc.). The integrated circuit device assembly 3100 includes components disposed on a first face 3140 of the circuit board 3102 and an opposing second face 3142 of the circuit board 3102; generally, components may be disposed on one or both faces 3140 and 3142.

In some embodiments, the circuit board 3102 may be a printed circuit board (PCB) including multiple metal (or interconnect) layers separated from one another by layers of dielectric material and interconnected by electrically conductive vias. The individual metal layers comprise conductive traces. Any one or more of the metal layers may be formed in a desired circuit pattern to route electrical signals (optionally in conjunction with other metal layers) between the components coupled to the circuit board 3102. In other embodiments, the circuit board 3102 may be a non-PCB substrate. The integrated circuit device assembly 3100 illustrated in FIG. 31 includes a package-on-interposer structure 3136 coupled to the first face 3140 of the circuit board 3102 by coupling components 3116. The coupling components 3116 may electrically and mechanically couple the package-on-interposer structure 3136 to the circuit board 3102, and may include solder balls (as shown in FIG. 31), pins (e.g., as part of a pin grid array (PGA), contacts (e.g., as part of a land grid array (LGA)), male and female portions of a socket, an adhesive, an underfill material, and/or any other suitable electrical and/or mechanical coupling structure.

The package-on-interposer structure 3136 may include an integrated circuit component 3120 coupled to an interposer 3104 by coupling components 3118. The coupling components 3118 may take any suitable form for the application, such as the forms discussed above with reference to the coupling components 3116. Although a single integrated circuit component 3120 is shown in FIG. 31, multiple integrated circuit components may be coupled to the interposer 3104; indeed, additional interposers may be coupled to the interposer 3104. The interposer 3104 may provide an intervening substrate used to bridge the circuit board 3102 and the integrated circuit component 3120.

The integrated circuit component 3120 may be a packaged or unpacked integrated circuit product that includes one or more integrated circuit dies (e.g., the die 2802 of FIG. 28, the integrated circuit device 2900 of FIG. 29) and/or one or more other suitable components. A packaged integrated circuit component comprises one or more integrated circuit dies mounted on a package substrate with the integrated circuit dies and package substrate encapsulated in a casing material, such as a metal, plastic, glass, or ceramic. In one example of an unpackaged integrated circuit component 3120, a single monolithic integrated circuit die comprises solder bumps attached to contacts on the die. The solder bumps allow the die to be directly attached to the interposer 3104. The integrated circuit component 3120 can comprise one or more computing system components, such as one or more processor units (e.g., system-on-a-chip (SoC), processor core, graphics processor unit (GPU), accelerator, chipset processor), I/O controller, memory, or network interface controller. In some embodiments, the integrated circuit component 3120 can comprise one or more additional active or passive devices such as capacitors, decoupling capacitors, resistors, inductors, fuses, diodes, transformers, sensors, electrostatic discharge (ESD) devices, and memory devices.

In embodiments where the integrated circuit component 3120 comprises multiple integrated circuit dies, they dies can be of the same type (a homogeneous multi-die integrated circuit component) or of two or more different types (a heterogeneous multi-die integrated circuit component). A multi-die integrated circuit component can be referred to as a multi-chip package (MCP) or multi-chip module (MCM).

In addition to comprising one or more processor units, the integrated circuit component 3120 can comprise additional components, such as embedded DRAM, stacked high bandwidth memory (HBM), shared cache memories, input/output (I/O) controllers, or memory controllers. Any of these additional components can be located on the same integrated circuit die as a processor unit, or on one or more integrated circuit dies separate from the integrated circuit dies comprising the processor units. These separate integrated circuit dies can be referred to as "chiplets". In embodiments where an integrated circuit component comprises multiple integrated circuit dies, interconnections between dies can be provided by the package substrate, one or more silicon interposers, one or more silicon bridges embedded in the package substrate (such as Intel® embedded multi-die interconnect bridges (EMIBs)), or combinations thereof.

Generally, the interposer 3104 may spread connections to a wider pitch or reroute a connection to a different connection. For example, the interposer 3104 may couple the integrated circuit component 3120 to a set of ball grid array (BGA) conductive contacts of the coupling components 3116 for coupling to the circuit board 3102. In the embodiment illustrated in FIG. 31, the integrated circuit component 3120 and the circuit board 3102 are attached to opposing sides of the interposer 3104; in other embodiments, the integrated circuit component 3120 and the circuit board 3102 may be attached to a same side of the interposer 3104. In some embodiments, three or more components may be interconnected by way of the interposer 3104.

In some embodiments, the interposer 3104 may be formed as a PCB, including multiple metal layers separated from one another by layers of dielectric material and interconnected by electrically conductive vias. In some embodiments, the interposer 3104 may be formed of an epoxy resin, a fiberglass-reinforced epoxy resin, an epoxy resin with inorganic fillers, a ceramic material, or a polymer material such as polyimide. In some embodiments, the interposer 3104 may be formed of alternate rigid or flexible materials that may include the same materials described above for use in a semiconductor substrate, such as silicon, germanium, and other group III-V and group IV materials. The interposer 3104 may include metal interconnects 3108 and vias 3110, including but not limited to through hole vias 3110-1 (that extend from a first face 3150 of the interposer 3104 to a second face 3154 of the interposer 3104), blind vias 3110-2 (that extend from the first or second faces 3150 or 3154 of the interposer 3104 to an internal metal layer), and buried vias 3110-3 (that connect internal metal layers).

In some embodiments, the interposer 3104 can comprise a silicon interposer. Through silicon vias (TSV) extending through the silicon interposer can connect connections on a first face of a silicon interposer to an opposing second face of the silicon interposer. In some embodiments, an interposer 3104 comprising a silicon interposer can further comprise one or more routing layers to route connections on a first face of the interposer 3104 to an opposing second face of the interposer 3104.

The interposer 3104 may further include embedded devices 3114, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 3104. The package-on-interposer structure 3136 may take the form of any of the package-on-interposer structures known in the art. In embodiments where the interposer is a non-printed circuit board The integrated circuit device assembly 3100 may include an integrated circuit component 3124 coupled to the first face 3140 of the circuit board 3102 by coupling components 3122. The coupling components 3122 may take the form of any of the embodiments discussed above with reference to the coupling components 3116, and the integrated circuit component 3124 may take the form of any of the embodiments discussed above with reference to the integrated circuit component 3120.

The integrated circuit device assembly 3100 illustrated in FIG. 31 includes a package-on-package structure 3134 coupled to the second face 3142 of the circuit board 3102 by coupling components 3128. The package-on-package structure 3134 may include an integrated circuit component 3126 and an integrated circuit component 3132 coupled together by coupling components 3130 such that the integrated circuit component 3126 is disposed between the circuit board 3102 and the integrated circuit component 3132. The coupling components 3128 and 3130 may take the form of any of the embodiments of the coupling components 3116 discussed above, and the integrated circuit components 3126 and 3132 may take the form of any of the embodiments of the integrated circuit component 3120 discussed above. The package-on-package structure 3134 may be configured in accordance with any of the package-on-package structures known in the art.

Figure 32:
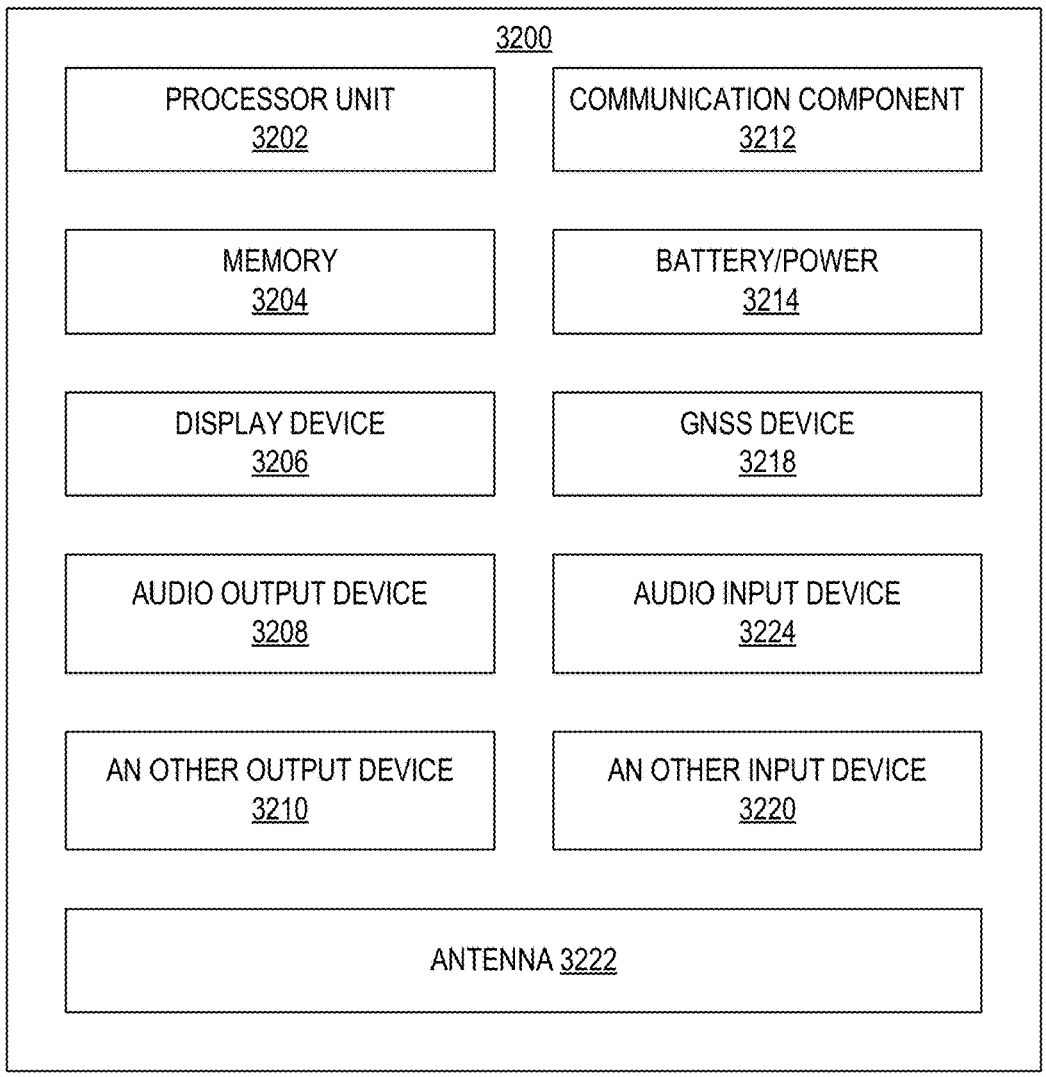
FIG. 32 is a block diagram of an example electrical device that may include a microelectronic assembly, in accordance with any of the embodiments disclosed herein.

FIG. 32 is a block diagram of an example electrical device 3200 that may include one or more of the HTAM structures disclosed herein. For example, any suitable ones of the components of the electrical device 3200 may include one or more of the integrated circuit device assemblies 3100, integrated circuit components 3120, integrated circuit devices 2900, or integrated circuit dies 2802 disclosed herein. A number of components are illustrated in FIG. 32 as included in the electrical device 3200, but any one or more of these components may be omitted or duplicated, as suitable for the application. In some embodiments, some or all of the components included in the electrical device 3200 may be attached to one or more motherboards mainboards, or system boards. In some embodiments, one or more of these components are fabricated onto a single system-on-a-chip (SoC) die.

Additionally, in various embodiments, the electrical device 3200 may not include one or more of the components illustrated in FIG. 32, but the electrical device 3200 may include interface circuitry for coupling to the one or more components. For example, the electrical device 3200 may not include a display device 3206, but may include display device interface circuitry (e.g., a connector and driver circuitry) to which a display device 3206 may be coupled. In another set of examples, the electrical device 3200 may not include an audio input device 3224 or an audio output device 3208, but may include audio input or output device interface circuitry (e.g., connectors and supporting circuitry) to which an audio input device 3224 or audio output device 3208 may be coupled.

The electrical device 3200 may include one or more processor units 3202 (e.g., one or more processor units). As used herein, the terms "processor unit", "processing unit" or "processor" may refer to any device or portion of a device that processes electronic data from registers and/or memory to transform that electronic data into other electronic data that may be stored in registers and/or memory. The processor unit 3202 may include one or more digital signal processors (DSPs), application-specific integrated circuits (ASICs), central processing units (CPUs), graphics processing units (GPUs), general-purpose GPUs (GPGPUs), accelerated processing units (APUs), field-programmable gate arrays (FPGAs), neural network processing units (NPUs), data processor units (DPUs), accelerators (e.g., graphics accelerator, compression accelerator, artificial intelligence accelerator), controller cryptoprocessors (specialized processors that execute cryptographic algorithms within hardware), server processors, controllers, or any other suitable type of processor units. As such, the processor unit can be referred to as an XPU (or xPU).

The electrical device 3200 may include a memory 3204, which may itself include one or more memory devices such as volatile memory (e.g., dynamic random access memory (DRAM), static random-access memory (SRAM)), non-volatile memory (e.g., read-only memory (ROM), flash memory, chalcogenide-based phase-change non-voltage memories), solid state memory, and/or a hard drive. In some embodiments, the memory 3204 may include memory that is located on the same integrated circuit die as the processor unit 3202. This memory may be used as cache memory (e.g., Level 1 (L1), Level 2 (L2), Level 3 (L3), Level 4 (L4), Last Level Cache (LLC)) and may include embedded dynamic random access memory (eDRAM) or spin transfer torque magnetic random access memory (STT-MRAM).

In some embodiments, the electrical device 3200 can comprise one or more processor units 3202 that are heterogeneous or asymmetric to another processor unit 3202 in the electrical device 3200. There can be a variety of differences between the processing units 3202 in a system in terms of a spectrum of metrics of merit including architectural, micro-architectural, thermal, power consumption characteristics, and the like. These differences can effectively manifest themselves as asymmetry and heterogeneity among the processor units 3202 in the electrical device 3200.

In some embodiments, the electrical device 3200 may include a communication component 3212 (e.g., one or more communication components). For example, the communication component 3212 can manage wireless communications for the transfer of data to and from the electrical device 3200. The term "wireless" and its derivatives may be used to describe circuits, devices, systems, methods, techniques, communications channels, etc., that may communicate data through the use of modulated electromagnetic radiation through a nonsolid medium. The term "wireless" does not imply that the associated devices do not contain any wires, although in some embodiments they might not.

The communication component 3212 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication component 3212 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication component 3212 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication component 3212 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication component 3212 may operate in accordance with other wireless protocols in other embodiments. The electrical device 3200 may include an antenna 3222 to facilitate wireless communications and/or to receive other wireless communications (such as AM or FM radio transmissions).

In some embodiments, the communication component 3212 may manage wired communications, such as electrical, optical, or any other suitable communication protocols (e.g., IEEE 802.3 Ethernet standards). As noted above, the communication component 3212 may include multiple communication components. For instance, a first communication component 3212 may be dedicated to shorter-range wireless communications such as Wi-Fi or Bluetooth, and a second communication component 3212 may be dedicated to longer-range wireless communications such as global positioning system (GPS), EDGE, GPRS, CDMA, WiMAX, LTE, EV-DO, or others. In some embodiments, a first communication component 3212 may be dedicated to wireless communications, and a second communication component 3212 may be dedicated to wired communications.

The electrical device 3200 may include battery/power circuitry 3214. The battery/power circuitry 3214 may include one or more energy storage devices (e.g., batteries or capacitors) and/or circuitry for coupling components of the electrical device 3200 to an energy source separate from the electrical device 3200 (e.g., AC line power).

The electrical device 3200 may include a display device 3206 (or corresponding interface circuitry, as discussed above). The display device 3206 may include one or more embedded or wired or wirelessly connected external visual indicators, such as a heads-up display, a computer monitor, a projector, a touchscreen display, a liquid crystal display (LCD), a light-emitting diode display, or a flat panel display.

The electrical device 3200 may include an audio output device 3208 (or corresponding interface circuitry, as discussed above). The audio output device 3208 may include any embedded or wired or wirelessly connected external device that generates an audible indicator, such speakers, headsets, or earbuds.

The electrical device 3200 may include an audio input device 3224 (or corresponding interface circuitry, as discussed above). The audio input device 3224 may include any embedded or wired or wirelessly connected device that generates a signal representative of a sound, such as microphones, microphone arrays, or digital instruments (e.g., instruments having a musical instrument digital interface (MIDI) output). The electrical device 3200 may include a Global Navigation Satellite System (GNSS) device 3218 (or corresponding interface circuitry, as discussed above), such as a Global Positioning System (GPS) device. The GNSS device 3218 may be in communication with a satellite-based system and may determine a geolocation of the electrical device 3200 based on information received from one or more GNSS satellites, as known in the art.

The electrical device 3200 may include an other output device 3210 (or corresponding interface circuitry, as discussed above). Examples of the other output device 3210 may include an audio codec, a video codec, a printer, a wired or wireless transmitter for providing information to other devices, or an additional storage device.

The electrical device 3200 may include an other input device 3220 (or corresponding interface circuitry, as discussed above). Examples of the other input device 3220 may include an accelerometer, a gyroscope, a compass, an image capture device (e.g., monoscopic or stereoscopic camera), a trackball, a trackpad, a touchpad, a keyboard, a cursor control device such as a mouse, a stylus, a touchscreen, proximity sensor, microphone, a bar code reader, a Quick Response (QR) code reader, electrocardiogram (ECG) sensor, PPG (photoplethysmogram) sensor, galvanic skin response sensor, any other sensor, or a radio frequency identification (RFID) reader.

The electrical device 3200 may have any desired form factor, such as a hand-held or mobile electrical device (e.g., a cell phone, a smart phone, a mobile internet device, a music player, a tablet computer, a laptop computer, a 2-in-1 convertible computer, a portable all-in-one computer, a netbook computer, an ultrabook computer, a personal digital assistant (PDA), an ultra mobile personal computer, a portable gaming console, etc.), a desktop electrical device, a server, a rack-level computing solution (e.g., blade, tray or sled computing systems), a workstation or other networked computing component, a printer, a scanner, a monitor, a set-top box, an entertainment control unit, a stationary gaming console, smart television, a vehicle control unit, a digital camera, a digital video recorder, a wearable electrical device or an embedded computing system (e.g., computing systems that are part of a vehicle, smart home appliance, consumer electronics product or equipment, manufacturing equipment). In some embodiments, the electrical device 3200 may be any other electronic device that processes data. In some embodiments, the electrical device 3200 may comprise multiple discrete physical components. Given the range of devices that the electrical device 3200 can be manifested as in various embodiments, in some embodiments, the electrical device 3200 can be referred to as a computing device or a computing system.

Some examples of embodiments are provided below. As used in the following examples, the term "connected" may refer to an electrical connection. In some instances, the connection may be a direct connection between two items/components. Further, as used in the following examples, the term "coupled" may refer to a connection that may be direct or indirect. For example, a first component coupled to a second component may include a third component connected between the first and second components.

Example 1 includes an integrated circuit component comprising a substrate; and one or more conductive traces on the substrate, wherein individual conductive traces of the one or more conductive traces have a feature size less than 50 micrometers, wherein individual conductive traces of the one or more conductive traces comprise a plurality of grains separated by grain boundaries, wherein individual grains of the plurality of grains of individual conductive traces of the one or more conductive traces have a diameter between 10 and 100 micrometers.

Example 2 includes the subject matter of Example 1, and wherein individual conductive traces of the plurality of conductive traces have a thickness of at least 50 micrometers.

Example 3 includes the subject matter of any of Examples 1 and 2, and wherein void spaces are defined between individual conductive traces of the one or more conductive traces.

Example 4 includes the subject matter of any of Examples 1-3, and wherein individual conductive traces of the one or more conductive traces comprise copper.

Example 5 includes the subject matter of any of Examples 1-4, and wherein individual conductive traces of the one or more conductive traces comprise silicon carbide particles.

Example 6 includes the subject matter of any of Examples 1-5, and wherein individual conductive traces of the one or more conductive traces comprise diamond particles.

Example 7 includes the subject matter of any of Examples 1-6, and wherein individual conductive traces of the one or more conductive traces comprise aluminum nitride particles.

Example 8 includes the subject matter of any of Examples 1-7, and wherein individual conductive traces of the one or more conductive traces comprise boron nitride particles.

Example 9 includes the subject matter of any of Examples 1-8, and wherein individual conductive traces of the one or more conductive traces comprise aluminum, silver, or gold.

Example 10 includes the subject matter of any of Examples 1-9, and further including a buffer layer between the substrate and the one or more conductive traces.

Example 11 includes the subject matter of any of Examples 1-10, and wherein the buffer layer comprises titanium, tantalum, gold, nickel, vanadium, silver, or copper.

Example 12 includes the subject matter of any of Examples 1-11, and wherein the one or more conductive traces are defined in an interior layer of a circuit board.

Example 13 includes the subject matter of any of Examples 1-12, and wherein the one or more conductive traces are defined on a surface layer of a circuit board.

Example 14 includes the subject matter of any of Examples 1-13, and further including a die mated to a circuit board, wherein the one or more conductive traces are defined on a backside of the die.

Example 15 includes the subject matter of any of Examples 1-14, and further including a die mated to a circuit board, wherein the one or more conductive traces are defined on a front side of the die.

Example 16 includes the subject matter of any of Examples 1-15, and wherein the substrate is an organic package.

Example 17 includes the subject matter of any of Examples 1-16, and wherein the substrate is an inorganic package.

Example 18 includes the subject matter of any of Examples 1-17, and wherein the substrate is an active semiconductor die.

Example 19 includes the subject matter of any of Examples 1-18, and wherein the substrate is a passive semiconductor die.

Example 20 includes the subject matter of any of Examples 1-19, and wherein the substrate is a reusable carrier.

Example 21 includes a system comprising the integrated circuit component of Example 1, wherein the integrated circuit component is a processor, further comprising a circuit board, the processor mated to the circuit board; and a memory mated to the circuit board and communicatively coupled to the processor.

Example 22 includes a method comprising depositing one or more sacrificial dielectric traces on a substrate; depositing a conductive layer on the one or more sacrificial dielectric traces using cold spray; planarizing the conductive layer to expose the one or more sacrificial dielectric traces; and removing the one or more sacrificial dielectric traces without removing the conductive layer.

Example 23 includes the subject matter of Example 22, and wherein the conductive layer comprises a plurality of grains separated by grain boundaries, wherein individual grains of the plurality of grains have a diameter between 10 and 100 micrometers.

Example 24 includes the subject matter of any of Examples 22 and 23, and wherein depositing the one or more sacrificial dielectric traces comprises depositing the one or more sacrificial dielectric traces using inkjet printing.

Example 25 includes the subject matter of any of Examples 22-24, and wherein depositing the one or more sacrificial dielectric traces comprises depositing the one or more sacrificial dielectric traces using lithographic patterning.

Example 26 includes the subject matter of any of Examples 22-25, and wherein depositing the one or more sacrificial dielectric traces comprises depositing the one or more sacrificial dielectric traces using laser patterning.

Example 27 includes the subject matter of any of Examples 22-26, and wherein depositing the one or more sacrificial dielectric traces comprises depositing the one or more sacrificial dielectric traces using reactive ion etching.

Example 28 includes the subject matter of any of Examples 22-27, and wherein the one or more sacrificial dielectric traces comprises an elastomer.

Example 29 includes the subject matter of any of Examples 22-28, and wherein the one or more sacrificial dielectric traces comprises silicone.

Example 30 includes the subject matter of any of Examples 22-29, and wherein the one or more sacrificial dielectric traces comprises one or more sacrificial dielectric traces on two or more layers.

Example 31 includes the subject matter of any of Examples 22-30, and wherein depositing the one or more sacrificial dielectric traces comprises depositing the one or more sacrificial dielectric traces using grayscale lithography.

Example 32 includes the subject matter of any of Examples 22-31, and further including depositing a buffer layer over the one or more sacrificial dielectric traces and the substrate before depositing the conductive layer.

Example 33 includes the subject matter of any of Examples 22-32, and wherein the buffer layer comprises titanium, tantalum, gold, nickel, vanadium, silver, or copper.

Example 34 includes the subject matter of any of Examples 22-33, and wherein depositing the buffer layer comprises sputtering a thin film on the one or more sacrificial dielectric traces and the substrate; and electroplating the thin film.

Example 35 includes the subject matter of any of Examples 22-34, and wherein removing the one or more sacrificial dielectric traces comprises removing the one or more sacrificial dielectric traces using chemical etching.

Example 36 includes the subject matter of any of Examples 22-35, and wherein removing the one or more sacrificial dielectric traces comprises removing the one or more sacrificial dielectric traces using reactive ion etching.

Example 37 includes an integrated circuit component comprising a substrate; and one or more conductive traces on the substrate, wherein individual conductive traces of the one or more conductive traces have a feature size less than 50 micrometers, wherein individual conductive traces of the plurality of conductive traces have a thickness of at least 50 micrometers.

Example 38 includes the subject matter of Example 37, and wherein individual conductive traces of the one or more conductive traces comprise a plurality of grains separated by grain boundaries, wherein individual grains of the plurality of grains of individual conductive traces of the one or more conductive traces have a diameter between 10 and 100 micrometers.

Example 39 includes the subject matter of any of Examples 37 and 38, and wherein void spaces are defined between individual conductive traces of the one or more conductive traces.

Example 40 includes the subject matter of any of Examples 37-39, and wherein individual conductive traces of the one or more conductive traces comprise copper.

Example 41 includes the subject matter of any of Examples 37-40, and wherein individual conductive traces of the one or more conductive traces comprise silicon carbide particles.

Example 42 includes the subject matter of any of Examples 37-41, and wherein individual conductive traces of the one or more conductive traces comprise diamond particles.

Example 43 includes the subject matter of any of Examples 37-42, and wherein individual conductive traces of the one or more conductive traces comprise aluminum nitride particles.

Example 44 includes the subject matter of any of Examples 37-43, and wherein individual conductive traces of the one or more conductive traces comprise boron nitride particles.

Example 45 includes the subject matter of any of Examples 37-44, and wherein individual conductive traces of the one or more conductive traces comprise aluminum, silver, or gold.

Example 46 includes the subject matter of any of Examples 37-45, and further including a buffer layer between the substrate and the one or more conductive traces.

Example 47 includes the subject matter of any of Examples 37-46, and wherein the buffer layer comprises titanium, tantalum, gold, nickel, vanadium, silver, or copper.

Example 48 includes the subject matter of any of Examples 37-47, and wherein the one or more conductive traces are defined in an interior layer of a circuit board.

Example 49 includes the subject matter of any of Examples 37-48, and wherein the one or more conductive traces are defined on a surface layer of a circuit board.

Example 50 includes the subject matter of any of Examples 37-49, and further including a die mated to a circuit board, wherein the one or more conductive traces are defined on a backside of the die.

Example 51 includes the subject matter of any of Examples 37-50, and further including a die mated to a circuit board, wherein the one or more conductive traces are defined on a front side of the die.

Example 52 includes the subject matter of any of Examples 37-51, and wherein the substrate is an organic package.

Example 53 includes the subject matter of any of Examples 37-52, and wherein the substrate is an inorganic package.

Example 54 includes the subject matter of any of Examples 37-53, and wherein the substrate is an active semiconductor die.

Example 55 includes the subject matter of any of Examples 37-54, and wherein the substrate is a passive semiconductor die.

Example 56 includes the subject matter of any of Examples 37-55, and wherein the substrate is a reusable carrier.

Example 57 includes a system comprising the integrated circuit component of Example 37, wherein the integrated circuit component is a processor, further comprising a circuit board, the processor mated to the circuit board; and a memory mated to the circuit board and communicatively coupled to the processor.

Example 58 includes an integrated circuit component comprising a substrate; a permanent dielectric layer on the substrate; and one or more conductive traces defined in the permanent dielectric layer, wherein individual conductive traces of the one or more conductive traces comprise a plurality of grains separated by grain boundaries, wherein individual grains of the plurality of grains of individual conductive traces of the one or more conductive traces have a diameter between 10 and 100 micrometers.

Example 59 includes the subject matter of Example 58, and wherein the permanent dielectric layer is a cured epoxy material.

Example 60 includes the subject matter of any of Examples 58 and 59, and wherein the permanent dielectric layer comprises filler particles.

Example 61 includes the subject matter of any of Examples 58-60, and wherein the filler particles are silica particles.

Example 62 includes the subject matter of any of Examples 58-61, and wherein individual conductive traces of the one or more conductive traces comprise silicon carbide particles.

Example 63 includes the subject matter of any of Examples 58-62, and wherein individual conductive traces of the one or more conductive traces comprise diamond particles.

Example 64 includes the subject matter of any of Examples 58-63, and wherein individual conductive traces of the one or more conductive traces comprise aluminum nitride particles.

Example 65 includes the subject matter of any of Examples 58-64, and wherein individual conductive traces of the one or more conductive traces comprise boron nitride particles.

Example 66 includes the subject matter of any of Examples 58-65, and wherein the permanent dielectric layer is a resin or polymer material.

Example 67 includes the subject matter of any of Examples 58-66, and wherein the permanent dielectric layer is not a photodefinable material.

Example 68 includes the subject matter of any of Examples 58-67, and wherein individual conductive traces of the one or more conductive traces have a feature size less than 50 micrometers.

Example 69 includes the subject matter of any of Examples 58-68, and wherein individual conductive traces of the plurality of conductive traces have a thickness of at least 50 micrometers.

Example 70 includes the subject matter of any of Examples 58-69, and wherein individual conductive traces of the one or more conductive traces comprise copper.

Example 71 includes the subject matter of any of Examples 58-70, and wherein individual conductive traces of the one or more conductive traces comprise aluminum, silver, or gold.

Example 72 includes the subject matter of any of Examples 58-71, and wherein the one or more conductive traces are defined in an interior layer of a circuit board.

Example 73 includes the subject matter of any of Examples 58-72, and wherein the one or more conductive traces are defined on a surface layer of a circuit board.

Example 74 includes the subject matter of any of Examples 58-73, and further including a die mated to a circuit board, wherein the one or more conductive traces are defined on a backside of the die.

Example 75 includes the subject matter of any of Examples 58-74, and further including a die mated to a circuit board, wherein the one or more conductive traces are defined on a front side of the die.

Example 76 includes the subject matter of any of Examples 58-75, and wherein the substrate is an organic package.

Example 77 includes the subject matter of any of Examples 58-76, and wherein the substrate is an inorganic package.

Example 78 includes the subject matter of any of Examples 58-77, and wherein the substrate is an active semiconductor die.

Example 79 includes the subject matter of any of Examples 58-78, and wherein the substrate is a passive semiconductor die.

Example 80 includes the subject matter of any of Examples 58-79, and wherein the substrate is a reusable carrier.

Example 81 includes a system comprising the integrated circuit component of Example 59, wherein the integrated circuit component is a processor, further comprising a circuit board, the processor mated to the circuit board; and a memory mated to the circuit board and communicatively coupled to the processor.

Example 82 includes a method comprising depositing a permanent dielectric layer on a substrate; defining one or more trenches in the permanent dielectric layer; and depositing one or more conductive traces in the one or more trenches using cold spray.

Example 83 includes the subject matter of Example 82, and wherein defining one or more trenches in the permanent dielectric layer comprises directing a laser beam at the permanent dielectric layer to define the one or more trenches by removing material from the permanent dielectric layer.

Example 84 includes the subject matter of any of Examples 82 and 83, and wherein defining one or more trenches in the permanent dielectric layer comprises defining the one or more trenches using nanoimprint lithography.

Example 85 includes the subject matter of any of Examples 82-84, and wherein depositing the permanent dielectric layer comprises depositing the permanent dielectric layer using inkjet printing.

Example 86 includes the subject matter of any of Examples 82-85, and wherein the permanent dielectric layer is a cured epoxy material.

Example 87 includes the subject matter of any of Examples 82-86, and wherein the permanent dielectric layer comprises filler particles.

Example 88 includes the subject matter of any of Examples 82-87, and wherein the filler particles are silica particles.

Example 89 includes the subject matter of any of Examples 82-88, and wherein the permanent dielectric layer is a resin or polymer material.

Example 90 includes the subject matter of any of Examples 82-89, and wherein the permanent dielectric layer is not a photodefinable material.

Example 91 includes the subject matter of any of Examples 82-90, and wherein defining the one or more trenches in the permanent dielectric layer comprises defining the one or more trenches in the permanent dielectric layer with a first process, the method further comprising defining a via from a trench of the one or more trenches to a conductive trace below the trench with a second process different from the first process.

Example 92 includes the subject matter of any of Examples 82-91, and wherein the second process is laser drilling.

Example 93 includes the subject matter of any of Examples 82-92, and wherein individual conductive traces of the one or more conductive traces comprise a plurality of grains separated by grain boundaries, wherein individual grains of the plurality of grains have a diameter between 10 and 100 micrometers.

Example 94 includes the subject matter of any of Examples 82-93, and further including depositing a buffer layer over the one or more trenches and the permanent dielectric layer before depositing the one or more conductive traces.

Example 95 includes the subject matter of any of Examples 82-94, and wherein the buffer layer comprises titanium, tantalum, gold, nickel, vanadium, silver, or copper.

Example 96 includes an integrated circuit component comprising a substrate; a permanent dielectric layer on the substrate; and one or more conductive traces defined in the permanent dielectric layer, wherein the permanent dielectric layer is not a photodefinable material.

Example 97 includes the subject matter of Example 96, and wherein the permanent dielectric layer is a cured epoxy material.

Example 98 includes the subject matter of any of Examples 96 and 97, and wherein the permanent dielectric layer comprises filler particles.

Example 99 includes the subject matter of any of Examples 96-98, and wherein the filler particles are silica particles.

Example 100 includes the subject matter of any of Examples 96-99, and wherein the permanent dielectric layer is a resin or polymer material.

Example 101 includes the subject matter of any of Examples 96-100, and wherein individual conductive traces of the one or more conductive traces comprise a plurality of grains separated by grain boundaries, wherein individual grains of the plurality of grains of individual conductive traces of the one or more conductive traces have a diameter between 10 and 100 micrometers.

Example 102 includes the subject matter of any of Examples 96-101, and wherein individual conductive traces of the one or more conductive traces have a feature size less than 50 micrometers.

Example 103 includes the subject matter of any of Examples 96-102, and wherein individual conductive traces of the plurality of conductive traces have a thickness of at least 50 micrometers.

Example 104 includes the subject matter of any of Examples 96-103, and wherein individual conductive traces of the one or more conductive traces comprise copper.

Example 105 includes the subject matter of any of Examples 96-104, and wherein individual conductive traces of the one or more conductive traces comprise silicon carbide particles.

Example 106 includes the subject matter of any of Examples 96-105, and wherein individual conductive traces of the one or more conductive traces comprise diamond particles.

Example 107 includes the subject matter of any of Examples 96-106, and wherein individual conductive traces of the one or more conductive traces comprise aluminum nitride particles.

Example 108 includes the subject matter of any of Examples 96-107, and wherein individual conductive traces of the one or more conductive traces comprise boron nitride particles.

Example 109 includes the subject matter of any of Examples 96-108, and wherein individual conductive traces of the one or more conductive traces comprise aluminum, silver, or gold.

Example 110 includes the subject matter of any of Examples 96-109, and wherein the one or more conductive traces are defined in an interior layer of a circuit board.

Example 111 includes the subject matter of any of Examples 96-110, and wherein the one or more conductive traces are defined on a surface layer of a circuit board.

Example 112 includes the subject matter of any of Examples 96-111, and further including a die mated to a circuit board, wherein the one or more conductive traces are defined on a backside of the die.

Example 113 includes the subject matter of any of Examples 96-112, and further including a die mated to a circuit board, wherein the one or more conductive traces are defined on a front side of the die.

Example 114 includes the subject matter of any of Examples 96-113, and wherein the substrate is an organic package.

Example 115 includes the subject matter of any of Examples 96-114, and wherein the substrate is an inorganic package.

Example 116 includes the subject matter of any of Examples 96-115, and wherein the substrate is an active semiconductor die.

Example 117 includes the subject matter of any of Examples 96-116, and wherein the substrate is a passive semiconductor die.

Example 118 includes the subject matter of any of Examples 96-117, and wherein the substrate is a reusable carrier.

Example 119 includes a system comprising the integrated circuit component of Example 96, wherein the integrated circuit component is a processor, further comprising a circuit board, the processor mated to the circuit board; and a memory mated to the circuit board and communicatively coupled to the processor.

Example 120 includes an integrated circuit component comprising a substrate; one or more conductive traces on the substrate, wherein individual conductive traces of the one or more conductive traces have tapered sidewalls; one or more buffer stacks over the one or more conductive traces; and a conductive layer over the one or more buffer stacks, wherein conductive layer comprises a plurality of grains separated by grain boundaries, wherein individual grains of the plurality of grains of individual conductive traces of the one or more conductive traces have a diameter between 10 and 100 micrometers.

Example 121 includes the subject matter of Example 120, and wherein individual conductive traces of the one or more conductive traces have tapered sidewalls with a taper angle between 10 and 45 degrees.

Example 122 includes the subject matter of any of Examples 120 and 121, and wherein individual buffer stacks of the one or more buffer stacks comprise a dielectric layer over the one or more conductive traces and a buffer layer over the dielectric layer.

Example 123 includes the subject matter of any of Examples 120-122, and wherein the dielectric layer of individual buffer stacks of the one or more buffer stacks comprises (i) silicon and nitrogen, (ii) silicon, carbon, and nitrogen, (iv) titanium and oxygen, (v) hafnium and oxygen, (vi) silicon and oxygen, (vii) aluminum and nitrogen, or (viii) aluminum and oxygen.

Example 124 includes the subject matter of any of Examples 120-123, and wherein the buffer layer of individual buffer stacks of the one or more buffer stacks comprises titanium, tantalum, gold, nickel, vanadium, silver, or copper.

Example 125 includes the subject matter of any of Examples 120-124, and wherein the conductive layer has a thickness of at least 50 micrometers.

Example 126 includes the subject matter of any of Examples 120-125, and wherein the conductive layer comprise copper.

Example 127 includes the subject matter of any of Examples 120-126, and wherein the conductive layer comprises silicon carbide particles.

Example 128 includes the subject matter of any of Examples 120-127, and wherein the conductive layer comprises diamond particles.

Example 129 includes the subject matter of any of Examples 120-128, and wherein the conductive layer comprises aluminum nitride particles.

Example 130 includes the subject matter of any of Examples 120-129, and wherein the conductive layer comprises boron nitride particles.

Example 131 includes the subject matter of any of Examples 120-130, and wherein the conductive layer comprises aluminum, silver, or gold.

Example 132 includes the subject matter of any of Examples 120-131, and wherein the one or more conductive traces are defined in an interior layer of a circuit board.

Example 133 includes the subject matter of any of Examples 120-132, and wherein the one or more conductive traces are defined on a surface layer of a circuit board.

Example 134 includes the subject matter of any of Examples 120-133, and further including a die mated to a circuit board, wherein the one or more conductive traces are defined on a backside of the die.

Example 135 includes the subject matter of any of Examples 120-134, and further including a die mated to a circuit board, wherein the one or more conductive traces are defined on a front side of the die.

Example 136 includes the subject matter of any of Examples 120-135, and wherein the substrate is an organic package.

Example 137 includes the subject matter of any of Examples 120-136, and wherein the substrate is an inorganic package.

Example 138 includes the subject matter of any of Examples 120-137, and wherein the substrate is an active semiconductor die.

Example 139 includes the subject matter of any of Examples 120-138, and wherein the substrate is a passive semiconductor die.

Example 140 includes the subject matter of any of Examples 120-139, and wherein the substrate is a reusable carrier.

Example 141 includes a system comprising the integrated circuit component of Example 120, wherein the integrated circuit component is a processor, further comprising a circuit board, the processor mated to the circuit board; and a memory mated to the circuit board and communicatively coupled to the processor.

Example 142 includes a method comprising depositing a first conductive layer on a substrate; patterning one or more conductive traces from the first conductive layer using subtractive manufacturing, wherein individual conductive traces of the one or more conductive traces have tapered sidewalls; depositing one or more buffer stacks over the one or more conductive traces; and depositing a second conductive layer over the one or more buffer stacks using additive manufacturing.

Example 143 includes the subject matter of Example 142, and wherein depositing the second conductive layer comprises depositing the second conductive layer using cold spray.

Example 144 includes the subject matter of any of Examples 142 and 143, and wherein individual conductive traces of the one or more conductive traces have tapered sidewalls with a taper angle between 10 and 45 degrees.

Example 145 includes the subject matter of any of Examples 142-144, and wherein individual buffer stacks of the one or more buffer stacks comprise a dielectric layer over the one or more conductive traces and a buffer layer over the dielectric layer.

Example 146 includes the subject matter of any of Examples 142-145, and wherein the dielectric layer of individual buffer stacks of the one or more buffer stacks comprises (i) silicon and nitrogen, (ii) silicon, carbon, and nitrogen, (iv) titanium and oxygen, (v) hafnium and oxygen, (vi) silicon and oxygen, (vii) aluminum and nitrogen, or (viii) aluminum and oxygen.

Example 147 includes the subject matter of any of Examples 142-146, and wherein the buffer layer of individual buffer stacks of the one or more buffer stacks comprises titanium, tantalum, gold, nickel, vanadium, silver, or copper.

Example 148 includes the subject matter of any of Examples 142-147, and wherein the second conductive layer comprises a plurality of grains separated by grain boundaries, wherein individual grains of the plurality of grains have a diameter between 10 and 100 micrometers.

Example 149 includes the subject matter of any of Examples 142-148, and wherein patterning the one or more conductive traces comprises patterning the one or more conductive traces using chemical etching with a mask.

Example 150 includes the subject matter of any of Examples 142-149, and wherein depositing the first conductive layer on the substrate comprises depositing a seed layer on the substrate; and electroplating the seed layer.

Example 151 includes an integrated circuit component comprising a substrate; one or more conductive traces on the substrate, wherein individual conductive traces of the one or more conductive traces have tapered sidewalls; one or more buffer stacks over the one or more conductive traces; and a conductive layer over the one or more buffer stacks, wherein individual buffer stacks of the one or more buffer stacks comprise a dielectric layer over the one or more conductive traces and a buffer layer over the dielectric layer.

Example 152 includes the subject matter of Example 151, and wherein individual conductive traces of the one or more conductive traces have tapered sidewalls with a taper angle between 10 and 45 degrees.

Example 153 includes the subject matter of any of Examples 151 and 152, and wherein conductive layer comprises a plurality of grains separated by grain boundaries, wherein individual grains of the plurality of grains of individual conductive traces of the one or more conductive traces have a diameter between 10 and 100 micrometers.

Example 154 includes the subject matter of any of Examples 151-153, and wherein the dielectric layer of individual buffer stacks of the one or more buffer stacks comprises (i) silicon and nitrogen, (ii) silicon, carbon, and nitrogen, (iv) titanium and oxygen, (v) hafnium and oxygen, (vi) silicon and oxygen, (vii) aluminum and nitrogen, or (viii) aluminum and oxygen.

Example 155 includes the subject matter of any of Examples 151-154, and wherein the buffer layer of individual buffer stacks of the one or more buffer stacks comprises titanium, tantalum, gold, nickel, vanadium, silver, or copper.

Example 156 includes the subject matter of any of Examples 151-155, and wherein the conductive layer has a thickness of at least 50 micrometers.

Example 157 includes the subject matter of any of Examples 151-156, and wherein the conductive layer comprise copper.

In the foregoing, a detailed description has been given with reference to specific example embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment(s) and other exemplarily language does not necessarily refer to the same embodiment or the same example, but may refer to different and distinct embodiments, as well as potentially the same embodiment.

The invention claimed is:

1. An integrated circuit component comprising:
   a substrate; and
   one or more conductive traces on the substrate,
   wherein individual conductive traces of the one or more conductive traces have a feature size less than 50 micrometers,
   wherein individual conductive traces of the one or more conductive traces comprise a plurality of grains separated by grain boundaries, wherein individual grains of the plurality of grains of individual conductive traces of the one or more conductive traces have a diameter between 10 and 100 micrometers,
   wherein individual conductive traces of the one or more conductive traces have a thickness of at least 50 micrometers.

2. The integrated circuit component of claim 1, wherein void spaces are defined between individual conductive traces of the one or more conductive traces.

3. The integrated circuit component of claim 1, wherein individual conductive traces of the one or more conductive traces comprise copper.

4. The integrated circuit component of claim 3, wherein individual conductive traces of the one or more conductive traces comprise silicon carbide particles.

5. The integrated circuit component of claim 3, wherein individual conductive traces of the one or more conductive traces comprise diamond particles.

6. The integrated circuit component of claim 3, wherein individual conductive traces of the one or more conductive traces comprise aluminum nitride particles.

7. The integrated circuit component of claim 3, wherein individual conductive traces of the one or more conductive traces comprise boron nitride particles.

8. The integrated circuit component of claim 1, further comprising a buffer layer between the substrate and the one or more conductive traces.

9. The integrated circuit component of claim 1, wherein the one or more conductive traces are defined on a surface layer of a circuit board.

10. The integrated circuit component of claim 1, further comprising a die mated to a circuit board, wherein the one or more conductive traces are defined on a front side of the die.

11. The integrated circuit component of claim 1, wherein the substrate is an active semiconductor die.

12. The integrated circuit component of claim 1, wherein the substrate is a passive semiconductor die.

13. The integrated circuit component of claim 1, wherein the substrate is a reusable carrier.

14. The integrated circuit component of claim 1, wherein the substrate is an organic package.

15. The integrated circuit component of claim 1, wherein the substrate is an inorganic package.

16. A system comprising the integrated circuit component of claim 1, wherein the integrated circuit component is a processor, further comprising:
    a circuit board, the processor mated to the circuit board; and
    a memory mated to the circuit board and communicatively coupled to the processor.

17. A method comprising:
    depositing one or more sacrificial dielectric traces on a substrate for an integrated circuit component;
    depositing a conductive layer on the one or more sacrificial dielectric traces using cold spray;
    planarizing the conductive layer to expose the one or more sacrificial dielectric traces; and
    removing the one or more sacrificial dielectric traces without removing the conductive layer,
    wherein the conductive layer forms one or more conductive traces for the integrated circuit component.

18. The method of claim 17, wherein the conductive layer comprises a plurality of grains separated by grain boundaries, wherein individual grains of the plurality of grains have a diameter between 10 and 100 micrometers.

19. The method of claim 17, wherein depositing the one or more sacrificial dielectric traces comprises depositing the one or more sacrificial dielectric traces using inkjet printing.

20. The method of claim 17, wherein depositing the one or more sacrificial dielectric traces comprises depositing the one or more sacrificial dielectric traces using laser patterning.

21. The method of claim 17, wherein depositing the one or more sacrificial dielectric traces comprises depositing the one or more sacrificial dielectric traces using grayscale lithography.

22. The method of claim 17, further comprising depositing a buffer layer over the one or more sacrificial dielectric traces and the substrate before depositing the conductive layer.

23. The method of claim 22, wherein depositing the buffer layer comprises:
    sputtering a thin film on the one or more sacrificial dielectric traces and the substrate; and
    electroplating the thin film.

24. An integrated circuit component comprising:
    a substrate; and
    one or more conductive traces on the substrate,
    wherein individual conductive traces of the one or more conductive traces have a feature size less than 50 micrometers,
    wherein individual conductive traces of the one or more conductive traces have a thickness of at least 50 micrometers,
    wherein void spaces are defined between individual conductive traces of the one or more conductive traces.

25. The integrated circuit component of claim 24, wherein individual conductive traces of the one or more conductive traces comprise a plurality of grains separated by grain boundaries, wherein individual grains of the plurality of grains of individual conductive traces of the one or more conductive traces have a diameter between 10 and 100 micrometers.

* * * * *